(12) United States Patent
Varadarajan et al.

(10) Patent No.: US 11,075,127 B2
(45) Date of Patent: *Jul. 27, 2021

(54) SUPPRESSING INTERFACIAL REACTIONS BY VARYING THE WAFER TEMPERATURE THROUGHOUT DEPOSITION

(71) Applicant: Lam Research Corporation, Fremont, CA (US)

(72) Inventors: Seshasayee Varadarajan, Lake Oswego, OR (US); Aaron R. Fellis, San Jose, CA (US); Andrew John McKerrow, Lake Oswego, OR (US); James Samuel Sims, Tigard, OR (US); Ramesh Chandrasekharan, Portland, OR (US); Jon Henri, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/503,270

(22) Filed: Jul. 3, 2019

(65) Prior Publication Data

US 2020/0066607 A1 Feb. 27, 2020

Related U.S. Application Data

(63) Continuation of application No. 15/232,708, filed on Aug. 9, 2016, now Pat. No. 10,347,547.

(51) Int. Cl.
*H01L 21/66* (2006.01)
*H01L 21/67* (2006.01)
(Continued)

(52) U.S. Cl.
CPC .......... *H01L 22/20* (2013.01); *C23C 16/4586* (2013.01); *C23C 16/45542* (2013.01);
(Continued)

(58) Field of Classification Search
CPC combination set(s) only.
See application file for complete search history.

(56) References Cited

U.S. PATENT DOCUMENTS

| 3,020,131 A | 2/1962 | Knapic |
| 3,612,825 A | 10/1971 | Chase et al. |

(Continued)

FOREIGN PATENT DOCUMENTS

| CN | 101330015 A | 12/2008 |
| CN | 201343570 Y | 11/2009 |

(Continued)

OTHER PUBLICATIONS

U.S. Office Action, dated Jun. 30, 2017, issued in U.S. Appl. No. 14/466,925.

(Continued)

*Primary Examiner* — Mamadou L Diallo
(74) *Attorney, Agent, or Firm* — Weaver Austin Villeneuve & Sampson LLP

(57) ABSTRACT

Disclosed are methods of and apparatuses and systems for depositing a film in a multi-station deposition apparatus. The methods may include: (a) providing a substrate to a first station of the apparatus, (b) adjusting the temperature of the substrate to a first temperature, (c) depositing a first portion of the material on the substrate while the substrate is at the first temperature in the first station, (d) transferring the substrate to the second station, (e) adjusting the temperature of the substrate to a second temperature, and (f) depositing a second portion of the material on the substrate while the substrate is at the second temperature, such that the first portion and the second portion exhibit different values of a property of the material. The apparatuses and systems may include a multi-station deposition apparatus and a controller having control logic for performing one or more of (a)-(f).

20 Claims, 12 Drawing Sheets

(51) Int. Cl.
| | |
|---|---|
| *H01L 21/677* | (2006.01) |
| *H01L 21/02* | (2006.01) |
| *C23C 16/455* | (2006.01) |
| *C23C 16/458* | (2006.01) |
| *C23C 16/46* | (2006.01) |
| *C23C 16/505* | (2006.01) |
| *C23C 16/54* | (2006.01) |
| *C23C 16/50* | (2006.01) |
| *C23C 16/52* | (2006.01) |

(52) U.S. Cl.
CPC ........ *C23C 16/45544* (2013.01); *C23C 16/46* (2013.01); *C23C 16/50* (2013.01); *C23C 16/505* (2013.01); *C23C 16/52* (2013.01); *C23C 16/54* (2013.01); *H01L 21/022* (2013.01); *H01L 21/0217* (2013.01); *H01L 21/0228* (2013.01); *H01L 21/02274* (2013.01); *H01L 21/67207* (2013.01); *H01L 21/67248* (2013.01); *H01L 21/67745* (2013.01)

(56) References Cited

U.S. PATENT DOCUMENTS

| | | | |
|---|---|---|---|
| 3,704,219 A | 11/1972 | McDowell | |
| 4,457,359 A | 7/1984 | Holden | |
| 4,535,835 A | 8/1985 | Holden | |
| 4,563,589 A | 1/1986 | Scheffer | |
| 4,615,755 A | 10/1986 | Tracy et al. | |
| 4,927,786 A | 5/1990 | Nishida | |
| 4,949,783 A | 8/1990 | Lakios et al. | |
| 4,956,582 A | 9/1990 | Bourassa | |
| 5,028,560 A | 7/1991 | Tsukamoto et al. | |
| 5,113,929 A | 5/1992 | Nakagawa et al. | |
| 5,178,682 A | 1/1993 | Tsukamoto et al. | |
| 5,195,045 A | 3/1993 | Keane et al. | |
| 5,228,208 A | 7/1993 | White et al. | |
| 5,248,922 A | 9/1993 | Meshkat | |
| 5,282,121 A | 1/1994 | Bornhorst et al. | |
| 5,288,684 A | 2/1994 | Yamazaki et al. | |
| 5,298,939 A | 3/1994 | Swanson et al. | |
| 5,314,538 A | 5/1994 | Maeda et al. | |
| 5,407,524 A | 4/1995 | Patrick et al. | |
| 5,413,664 A | 5/1995 | Yagi et al. | |
| 5,447,431 A | 9/1995 | Muka | |
| 5,505,008 A | 4/1996 | Hugo et al. | |
| 5,552,927 A | 9/1996 | Wheatly et al. | |
| 5,556,549 A | 9/1996 | Patrick et al. | |
| 5,558,717 A | 9/1996 | Zhao et al. | |
| 5,562,947 A | 10/1996 | White et al. | |
| 5,588,827 A | 12/1996 | Muka | |
| 5,656,093 A | 8/1997 | Burkhart et al. | |
| 5,667,592 A | 9/1997 | Boitnott et al. | |
| 5,811,762 A | 9/1998 | Tseng | |
| 5,838,121 A | 11/1998 | Fairbairn et al. | |
| 5,942,075 A | 8/1999 | Nagahata et al. | |
| 6,015,503 A | 1/2000 | Butterbaugh et al. | |
| 6,072,163 A | 6/2000 | Armstrong et al. | |
| 6,087,632 A | 7/2000 | Mizosaki et al. | |
| 6,111,225 A | 8/2000 | Ohkase et al. | |
| 6,113,704 A | 9/2000 | Satoh et al. | |
| 6,200,634 B1 | 3/2001 | Johnsgard et al. | |
| 6,214,184 B1 | 4/2001 | Chien et al. | |
| 6,222,161 B1 | 4/2001 | Shirakawa et al. | |
| 6,228,438 B1 | 5/2001 | Schmitt | |
| 6,232,248 B1 | 5/2001 | Shinriki et al. | |
| 6,239,018 B1 | 5/2001 | Liu et al. | |
| 6,263,587 B1 | 7/2001 | Raaijmakers et al. | |
| 6,288,493 B1 | 9/2001 | Lee et al. | |
| 6,307,184 B1 | 10/2001 | Womack et al. | |
| 6,320,736 B1 | 11/2001 | Shamouilian et al. | |
| 6,394,797 B1 | 5/2002 | Sugaya et al. | |
| 6,410,457 B1 | 6/2002 | M'Saad et al. | |
| 6,413,321 B1 | 7/2002 | Kim et al. | |
| 6,435,869 B2 | 8/2002 | Kitamura | |
| 6,444,039 B1 | 9/2002 | Nguyen | |
| 6,467,491 B1 | 10/2002 | Sugiura et al. | |
| 6,544,340 B2 | 4/2003 | Yudovsky | |
| 6,559,424 B2 | 5/2003 | O'Carroll et al. | |
| 6,561,796 B1 | 5/2003 | Barrera et al. | |
| 6,563,092 B1 | 5/2003 | Shrinivasan et al. | |
| 6,563,686 B2 | 5/2003 | Tsai et al. | |
| 6,568,346 B2 | 5/2003 | Pu et al. | |
| 6,639,189 B2 | 10/2003 | Ramanan et al. | |
| 6,750,092 B2 | 6/2004 | Won et al. | |
| 6,753,508 B2 | 6/2004 | Shirakawa | |
| 6,756,085 B2 | 6/2004 | Waldfried et al. | |
| 6,768,084 B2 | 7/2004 | Liu et al. | |
| 6,800,173 B2 | 10/2004 | Chiang et al. | |
| 6,803,237 B2 | 10/2004 | Manganini et al. | |
| 6,821,906 B2 | 11/2004 | Wada et al. | |
| 6,851,403 B2 | 2/2005 | Durr et al. | |
| 6,860,965 B1 | 3/2005 | Stevens | |
| 6,887,523 B2 | 5/2005 | Zhuang et al. | |
| 6,895,179 B2 | 5/2005 | Kanno | |
| 6,899,765 B2 | 5/2005 | Krivts et al. | |
| 6,933,004 B2 | 8/2005 | Chan et al. | |
| 7,024,105 B2 | 4/2006 | Fodor et al. | |
| 7,025,831 B1 | 4/2006 | Butterbaugh et al. | |
| 7,097,712 B1 | 8/2006 | Yamazaki et al. | |
| 7,105,463 B2 | 9/2006 | Kurita et al. | |
| 7,138,606 B2 | 11/2006 | Kanno et al. | |
| 7,154,731 B1 | 12/2006 | Kueper | |
| 7,169,256 B2 | 1/2007 | Dhindsa et al. | |
| 7,189,432 B2 | 3/2007 | Chiang et al. | |
| 7,194,199 B2 | 3/2007 | Yoo | |
| 7,247,819 B2 | 7/2007 | Goto et al. | |
| 7,253,125 B1 | 8/2007 | Bandyopadhyay et al. | |
| 7,264,676 B2 | 9/2007 | Lai et al. | |
| 7,265,061 B1 | 9/2007 | Cho et al. | |
| 7,311,782 B2 | 12/2007 | Strang et al. | |
| 7,318,869 B2 | 1/2008 | Chiang et al. | |
| 7,327,948 B1 | 2/2008 | Shrinivasan et al. | |
| 7,332,445 B2 | 2/2008 | Lukas et al. | |
| 7,410,355 B2 | 8/2008 | Granneman et al. | |
| 7,576,303 B2 | 8/2009 | Natsuhara et al. | |
| 7,665,951 B2 | 2/2010 | Kurita et al. | |
| 7,704,894 B1 * | 4/2010 | Henri | H01L 21/31612 438/778 |
| 7,845,891 B2 | 12/2010 | Lee et al. | |
| 7,941,039 B1 | 5/2011 | Shrinivasan et al. | |
| 7,960,297 B1 | 6/2011 | Rivkin et al. | |
| 7,981,763 B1 | 7/2011 | Van Schravendijk et al. | |
| 8,033,771 B1 | 10/2011 | Gage et al. | |
| 8,047,706 B2 | 11/2011 | Goodman et al. | |
| 8,052,419 B1 | 11/2011 | Nordin et al. | |
| 8,137,465 B1 | 3/2012 | Shrinivasan et al. | |
| 8,211,510 B1 | 7/2012 | Varadarajan et al. | |
| 8,273,670 B1 | 9/2012 | Rivkin et al. | |
| 8,280,545 B2 | 10/2012 | Kondoh | |
| 8,288,288 B1 | 10/2012 | Gage et al. | |
| 8,371,567 B2 | 2/2013 | Angelov et al. | |
| 8,454,294 B2 | 6/2013 | Gage et al. | |
| 8,454,750 B1 | 6/2013 | Shrinivasan et al. | |
| 8,629,068 B1 | 1/2014 | Shrinivasan et al. | |
| 8,637,411 B2 | 1/2014 | Swaminathan et al. | |
| 8,673,080 B2 | 3/2014 | Meinhold et al. | |
| 8,715,418 B2 | 5/2014 | Chen | |
| 8,728,956 B2 | 5/2014 | LaVoie et al. | |
| 8,851,463 B2 | 10/2014 | Angelov et al. | |
| 8,920,162 B1 | 12/2014 | Nordin et al. | |
| 8,956,983 B2 | 2/2015 | Swaminathan et al. | |
| 8,971,009 B2 | 3/2015 | Parkhe et al. | |
| 8,980,769 B1 | 3/2015 | Haverkamp et al. | |
| 9,508,547 B1 | 11/2016 | Pasquale et al. | |
| 9,546,416 B2 * | 1/2017 | Yamazaki | C23C 14/541 |
| 9,835,388 B2 | 12/2017 | Gowdaru et al. | |
| 9,873,946 B2 | 1/2018 | Haverkamp et al. | |
| 10,347,547 B2 | 7/2019 | Varadarajan et al. | |
| 2002/0034886 A1 | 3/2002 | Kurita et al. | |
| 2002/0069820 A1 | 6/2002 | Yudovsky | |
| 2002/0117109 A1 | 8/2002 | Hazelton et al. | |
| 2002/0148563 A1 | 10/2002 | Carlson et al. | |
| 2002/0158060 A1 | 10/2002 | Uchiyama et al. | |

(56) References Cited

U.S. PATENT DOCUMENTS

| | | |
|---|---|---|
| 2002/0162630 A1 | 11/2002 | Satoh et al. |
| 2003/0013280 A1 | 1/2003 | Yamanaka |
| 2003/0033983 A1 | 2/2003 | Song |
| 2003/0113187 A1 | 6/2003 | Lei et al. |
| 2003/0157267 A1 | 8/2003 | Waldfried et al. |
| 2003/0199603 A1 | 10/2003 | Walker et al. |
| 2004/0018751 A1 | 1/2004 | Kusuda |
| 2004/0023513 A1 | 2/2004 | Aoyama et al. |
| 2004/0060917 A1 | 4/2004 | Liu et al. |
| 2004/0096593 A1 | 5/2004 | Lukas et al. |
| 2004/0149211 A1 | 8/2004 | Ahn et al. |
| 2004/0183226 A1 | 9/2004 | Newell et al. |
| 2004/0187790 A1 | 9/2004 | Bader et al. |
| 2004/0266214 A1 | 12/2004 | Suguro et al. |
| 2005/0006230 A1 | 1/2005 | Narushima et al. |
| 2005/0016687 A1 | 1/2005 | Shinriki et al. |
| 2005/0045616 A1 | 3/2005 | Ishihara |
| 2005/0056369 A1 | 3/2005 | Lai et al. |
| 2005/0164497 A1 | 7/2005 | Lopatin et al. |
| 2005/0166845 A1 | 8/2005 | Cox |
| 2005/0173412 A1 | 8/2005 | Kondou et al. |
| 2005/0226793 A1 | 10/2005 | Sakakura et al. |
| 2005/0255712 A1 | 11/2005 | Kato et al. |
| 2005/0258164 A1 | 11/2005 | Hiramatsu et al. |
| 2005/0264218 A1 | 12/2005 | Dhindsa et al. |
| 2005/0279384 A1 | 12/2005 | Guidotti |
| 2006/0018639 A1 | 1/2006 | Ramamurthy et al. |
| 2006/0075960 A1 | 4/2006 | Borgini et al. |
| 2006/0081186 A1 | 4/2006 | Shinriki et al. |
| 2006/0130757 A1 | 6/2006 | Li |
| 2006/0196425 A1 | 9/2006 | Hwang et al. |
| 2007/0006893 A1 | 1/2007 | Ji |
| 2007/0029046 A1 | 2/2007 | Li et al. |
| 2007/0107845 A1 | 5/2007 | Ishizawa et al. |
| 2007/0196011 A1 | 8/2007 | Cox et al. |
| 2007/0205788 A1 | 9/2007 | Natsuhara et al. |
| 2007/0243057 A1 | 10/2007 | Shimada et al. |
| 2007/0280816 A1 | 12/2007 | Kurita et al. |
| 2007/0283709 A1 | 12/2007 | Luse et al. |
| 2008/0053615 A1 | 3/2008 | Sago et al. |
| 2008/0102644 A1 | 5/2008 | Goto et al. |
| 2008/0134820 A1 | 6/2008 | Bjorck et al. |
| 2008/0169282 A1 | 7/2008 | Sorabji et al. |
| 2008/0217319 A1 | 9/2008 | Saule et al. |
| 2008/0237214 A1 | 10/2008 | Scheer et al. |
| 2008/0315292 A1 | 12/2008 | Ji et al. |
| 2009/0060480 A1 | 3/2009 | Herchen |
| 2009/0095220 A1 | 4/2009 | Meinhold et al. |
| 2009/0142167 A1 | 6/2009 | Gage et al. |
| 2009/0147819 A1 | 6/2009 | Goodman et al. |
| 2009/0269941 A1 | 10/2009 | Raisanen et al. |
| 2009/0277472 A1 | 11/2009 | Rivkin et al. |
| 2010/0163183 A1 | 7/2010 | Tanaka et al. |
| 2010/0247804 A1 | 9/2010 | Roy |
| 2010/0270004 A1 | 10/2010 | Landess et al. |
| 2011/0017424 A1 | 1/2011 | Parkhe et al. |
| 2011/0207245 A1 | 8/2011 | Koshimizu et al. |
| 2011/0318142 A1 | 12/2011 | Gage et al. |
| 2012/0006489 A1 | 1/2012 | Okita et al. |
| 2012/0009802 A1 | 1/2012 | LaVoie et al. |
| 2012/0074126 A1 | 3/2012 | Bang et al. |
| 2012/0161405 A1 | 6/2012 | Mohn et al. |
| 2012/0222616 A1 | 9/2012 | Han et al. |
| 2012/0264051 A1 | 10/2012 | Angelov et al. |
| 2013/0122431 A1 | 5/2013 | Angelov et al. |
| 2013/0145989 A1 | 6/2013 | Satitpunwaycha |
| 2013/0175005 A1 | 7/2013 | Gowdaru et al. |
| 2014/0080324 A1 | 3/2014 | Shrinivasan et al. |
| 2014/0170857 A1 | 6/2014 | Lang et al. |
| 2014/0209562 A1 | 7/2014 | LaVoie et al. |
| 2014/0216337 A1 | 8/2014 | Swaminathan et al. |
| 2015/0114292 A1 | 4/2015 | Haverkamp et al. |
| 2015/0249028 A1 | 9/2015 | Genetti et al. |
| 2016/0056032 A1 | 2/2016 | Baldasseroni et al. |
| 2017/0029947 A1* | 2/2017 | Kawahara ............... C23C 16/52 |
| 2017/0029948 A1* | 2/2017 | Jongbloed ......... H01L 21/28556 |
| 2017/0111028 A1* | 4/2017 | McCarron ............. C30B 25/186 |
| 2018/0047645 A1 | 2/2018 | Varadarajan et al. |
| 2018/0151336 A1 | 5/2018 | Sakka et al. |

FOREIGN PATENT DOCUMENTS

| | | |
|---|---|---|
| CN | 101689486 A | 3/2010 |
| CN | 102246287 A | 11/2011 |
| CN | 102543831 A | 7/2012 |
| CN | 103077917 A | 5/2013 |
| CN | 105088197 A | 11/2015 |
| CN | 105386012 A | 3/2016 |
| EP | 0746009 | 12/1996 |
| JP | 61-264649 | 11/1986 |
| JP | 62-229833 | 10/1987 |
| JP | 63-307740 | 12/1988 |
| JP | 01-107519 | 4/1989 |
| JP | H04211117 A | 8/1992 |
| JP | 05-031735 A | 2/1993 |
| JP | 05-138658 A | 6/1993 |
| JP | 06-037054 | 2/1994 |
| JP | 07-090582 | 4/1995 |
| JP | 07-147274 | 6/1995 |
| JP | 08-316215 | 11/1996 |
| JP | 09-092615 | 4/1997 |
| JP | 3090339 | 7/2000 |
| JP | 2000-286243 | 10/2000 |
| JP | 2001-104776 A | 4/2001 |
| JP | 2002-246375 | 8/2002 |
| JP | 2002-373862 | 12/2002 |
| JP | 2003-213430 | 7/2003 |
| JP | 2003-324048 | 11/2003 |
| JP | 2005-116655 | 4/2005 |
| JP | 2006-210372 | 8/2006 |
| JP | 2007-158074 | 6/2007 |
| JP | 2007-194582 A | 8/2007 |
| JP | 2008-503089 A | 1/2008 |
| JP | 2009-218536 | 9/2009 |
| KR | 10-2002-0096524 | 12/2002 |
| KR | 10-2003-0096732 | 12/2003 |
| KR | 10-0443415 | 11/2004 |
| KR | 10-2007-0115248 | 12/2007 |
| KR | 10-0836183 | 6/2008 |
| KR | 10-2008-0072275 | 8/2008 |
| TW | 200723352 | 6/2007 |
| TW | 200845283 | 11/2008 |
| WO | WO 98/54373 | 12/1998 |
| WO | WO 2000/19492 | 4/2000 |
| WO | WO 2002/11911 | 2/2002 |
| WO | WO 2007/067177 | 6/2007 |
| WO | WO 2007/145132 | 12/2007 |
| WO | WO 2009/001866 | 12/2008 |
| WO | WO 2009-102687 | 8/2009 |
| WO | WO 2010/068598 | 6/2010 |
| WO | WO 2010/101191 | 9/2010 |
| WO | WO 2012/141722 | 10/2012 |
| WO | WO 2013/103594 | 7/2013 |

OTHER PUBLICATIONS

U.S. Final Office Action dated Jan. 16, 2018 issued in U.S. Appl. No. 14/466,925.

U.S. Notice of Allowance dated Oct. 2, 2018 issued in U.S. Appl. No. 15/232,708.

U.S. Notice of Allowance dated Mar. 5, 2019 issued in U.S. Appl. No. 15/232,708.

U.S. Office Action, dated Jul. 18, 2006, issued in U.S. Appl. No. 11/184,101.

Notice of Allowance and Fee Due, dated Jan. 25, 2007, issued in U.S. Appl. No. 11/184,101.

U.S. Office Action, dated Jun. 8, 2010, issued in U.S. Appl. No. 11/851,310.

U.S. Notice of Allowance, dated Jan. 5, 2011, issued in U.S. Appl. No. 11/851,310.

U.S. Office Action dated Jun. 11, 2009 issued in U.S. Appl. No. 11/688,695.

(56) References Cited

OTHER PUBLICATIONS

U.S. Final Office Action dated Dec. 31, 2009 issued in U.S. Appl. No. 11/688,695.
U.S. Office Action dated Jul. 23, 2010 issued in U.S. Appl. No. 11/688,695.
U.S. Final Office Action dated Feb. 1, 2011 issued in U.S. Appl. No. 11/688,695.
U.S. Office Action dated Dec. 14, 2011 issued in U.S. Appl. No. 11/688,695.
U.S. Final Office Action dated Jun. 21, 2012 issued in U.S. Appl. No. 11/688,695.
U.S. Notice of Allowance dated Oct. 4, 2012 issued in U.S. Appl. No. 11/688,695.
U.S. Notice of Allowance dated Feb. 14, 2013 issued in U.S. Appl. No. 11/688,695.
U.S. Office Action dated Jul. 19, 2013 issued in U.S. Appl. No. 13/886,694.
U.S. Notice of Allowance dated Sep. 12, 2013 issued in U.S. Appl. No. 13/886,694.
U.S. Office Action dated Jun. 18, 2015 issued in U.S. Appl. No. 14/086,732.
U.S. Final Office Action dated Nov. 20, 2015 issued in U.S. Appl. No. 14/086,732.
U.S. Office Action dated Mar. 9, 2010 issued in U.S. Appl. No. 11/977,792.
U.S. Final Office Action dated Oct. 25, 2010 issued in U.S. Appl. No. 11/977,792.
U.S. Office Action dated Jul. 6, 2011 issued in U.S. Appl. No. 11/977,792.
U.S. Final Office Action dated Oct. 24, 2011 issued in U.S. Appl. No. 11/977,792.
U.S. Office Action dated Feb. 25, 2014 issued in U.S. Appl. No. 11/977,792.
U.S. Notice of Allowance dated Oct. 8, 2014 issued in U.S. Appl. No. 11/977,792.
U.S. Notice of Allowance dated Feb. 9, 2015 issued in U.S. Appl. No. 11/977,792.
U.S. Office Action dated Nov. 30, 2016 issued in U.S. Appl. No. 14/593,046.
U.S. Final Office Action dated May 1, 2017 issued in U.S. Appl. No. 14/593,046.
U.S. Notice of Allowance dated Sep. 7, 2017 issued in U.S. Appl. No. 14/593,046.
U.S. Office Action, dated Apr. 26, 2010, issued in U.S. Appl. No. 11/608,185.
U.S. Office Action, dated Nov. 26, 2010, issued in U.S. Appl. No. 11/608,185.
U.S. Notice of Allowance, dated Mar. 22, 2011, issued in U.S. Appl. No. 11/608,185.
U.S. Office Action, dated Apr. 9, 2010, issued in U.S. Appl. No. 11/937,364.
U.S. Final Office Action, dated Dec. 27, 2010, issued in U.S. Appl. No. 11/937,364.
U.S. Notice of Allowance, dated Sep. 19, 2011, issued in U.S. Appl. No. 11/937,364.
U.S. Office Action, dated Oct. 24, 2012, issued in U.S. Appl. No. 13/276,202.
U.S. Final Office Action, dated Jun. 6, 2013, issued in U.S. Appl. No. 13/276,202.
U.S. Final Office Action, dated Jan. 30, 2014, issued in U.S. Appl. No. 13/276,202.
U.S. Notice of Allowance, dated Aug. 1, 2014, issued in U.S. Appl. No. 13/276,202.
U.S. Office Action, dated Jan. 4, 2012, issued in U.S. Appl. No. 12/140,196.
U.S. Notice of Allowance, dated Jun. 15, 2012, issued in U.S. Appl. No. 12/140,196.
U.S. Office Action, dated Dec. 28, 2011, issued in U.S. Appl. No. 12/435,890.
U.S. Final Office Action, dated Apr. 12, 2012, issued in U.S. Appl. No. 12/435,890.
U.S. Office Action, dated Aug. 22, 2012, issued in U.S. Appl. No. 12/435,890.
U.S. Office Action, dated Feb. 28, 2013, issued in U.S. Appl. No. 12/435,890.
U.S. Office Action, dated May 22, 2014, issued in U.S. Appl. No. 12/435,890.
U.S. Final Office Action, dated Nov. 28, 2014, issued in U.S. Appl. No. 12/435,890.
U.S. Office Action, dated Dec. 27, 2010, issued in U.S. Appl. No. 12/333,239.
U.S. Final Office Action, dated Mar. 9, 2011, issued in U.S. Appl. No. 12/333,239.
U.S. Notice of Allowance, dated Jun. 27, 2011, issued in U.S. Appl. No. 12/333,239.
U.S. Office Action, dated Oct. 22, 2012, issued in U.S. Appl. No. 13/227,160.
U.S. Notice of Allowance, dated Feb. 27, 2013, issued in U.S. Appl. No. 13/227,160.
U.S. Office Action, dated Feb. 6, 2012, issued in U.S. Appl. No. 12/749,170.
U.S. Final Office Action, dated Jun. 20, 2012, issued in U.S. Appl. No. 12/749,170.
U.S. Notice of Allowance, dated Oct. 10, 2012, issued in U.S. Appl. No. 13/086,010.
U.S. Office Action, dated Jan. 3, 2014, issued in U.S. Appl. No. 13/736,410.
U.S. Notice of Allowance dated May 12, 2014 issued in U.S. Appl. No. 13/736,410.
U.S. Notice of Allowance dated Aug. 8, 2014 issued in U.S. Appl. No. 13/736,410.
U.S. Office Action, dated Nov. 20, 2015, issued in U.S. Appl. No. 13/730,605.
U.S. Final Office Action, dated Jul. 1, 2016, issued in U.S. Appl. No. 13/730,605.
U.S. Office Action, dated Feb. 9, 2017, issued in U.S. Appl. No. 13/730,605.
U.S. Notice of Allowance, dated Aug. 30, 2017, issued in U.S. Appl. No. 13/730,605.
U.S. Notice of Allowance, dated Oct. 26, 2017, issued in U.S. Appl. No. 13/730,605.
Chinese First Office Action dated Jul. 13, 2017 issued in Application No. CN 201510519683.6.
Chinese First Office Action dated Mar. 5, 2019 issued in Application No. CN 201710673939.8.
Chinese Second Office Action dated Sep. 6, 2019 issued in Application No. CN 201710673939.8.
Chinese Second Office Action dated Sep. 30, 2018 issued in Application No. CN 201510519683.6.
Taiwan Office Action dated May 26, 2014 issued in Application No. TW098114857.
PCT International Search Report and Written Opinion, dated Aug. 2, 2010, issued in PCT/US2009/067040.
PCT International Report on Patentability and Written Opinion dated Jun. 3, 2011 issued in PCT/US2009/067040.
Chinese First Office Action dated Jan. 23, 2013 issued in Application No. CN 200980149339.5.
Chinese Second Office Action dated Sep. 11, 2013 issued in Application No. CN 200980149339.5.
Korean Office Action dated Feb. 1, 2016 issued in Application No. KR 10-2011-7015366.
Taiwan Office Action and Search Report dated Jul. 11, 2014 issued in Application No. TW098142343.
Taiwan Office Action dated Nov. 21, 2014 issued in Application No. TW098142343.
PCT International Search Report and Written Opinion dated Apr. 6, 2012 issued in PCT/US2011/034819.
PCT International Preliminary Report on Patentability and Written Opinion dated Oct. 24, 2013, issued in PCT/US2011/034819.
Chinese First Office Action dated Sep. 16, 2014 issued in Application No. CN 20118006929.X.

(56) References Cited

OTHER PUBLICATIONS

Chinese Second Office Action [no translation] dated Feb. 28, 2015 issued in Application No. CN 20118006929.X.
Japanese Notice of Reasons for Rejection dated Apr. 9, 2013 issued in Application No. JP 2013-510129.
Taiwan Office Action dated Sep. 7, 2015 issued in Application No. TW 100117275.
Taiwan Notice of Allowance and Search Report dated Mar. 29, 2016 issued in Application No. TW 105102104.
PCT International Search Report and Written Opinion dated Apr. 12, 2013 issued in PCT/US2012/071976.
PCT International Preliminary Report on Patentability dated Jul. 17, 2014 issued in PCT/US2012/071976.
Chinese First Office Action dated Jan. 15, 2016 issued in Application No. CN 201280066240.0.
Chinese Second Office Action dated Aug. 31, 2016 issued in Application No. CN 201280066240.0.
Chinese Third Office Action dated Mar. 13, 2017 issued in Application No. CN 201280066240.0.
Korean First Office Action dated Sep. 19, 2019 issued in Application No. KR 10-2014-7022086.
Taiwan Examination and Search Report dated Aug. 9, 2016 issued in Application No. TW 102100308.
Arghavani et al., (2007) "Strain Engineering in Non-Volatile Memories," *Reed Business Information*, 6 pp.
U.S. Appl. No. 11/751,584, filed May 21, 2007, Shrinivasan et al.
U.S. Appl. No. 11/546,189, filed Oct. 10, 2006, Doble et al.
U.S. Appl. No. 13/621,060, filed Sep. 15, 2012, Gage et al.
U.S. Appl. No. 11/129,266, filed May 12, 2005, Landess et al.
U.S. Office Action, dated Jun. 16, 2008, issued in U.S. Appl. No. 11/546,189.
U.S. Final Office Action, dated Oct. 16, 2008, issued in U.S. Appl. No. 11/546,189.
U.S. Office Action, dated Oct. 6, 2015, issued in U.S. Appl. No. 13/621,060.
U.S. Final Office Action, dated Apr. 22, 2016, issued in U.S. Appl. No. 13/621,060.
U.S. Office Action, dated Feb. 20, 2009, issued in U.S. Appl. No. 11/129,266.
U.S. Office Action, dated Oct. 28, 2009, issued in U.S. Appl. No. 11/129,266.
International Search Report and Written Opinion dated Jul. 2, 2020 issued in Application No. PCT/US2020/021323.
Korean Second Office Action dated Mar. 27, 2020 issued in Application No. KR 10-2014-7022086.

\* cited by examiner

SUPPRESSING INTERFACIAL REACTIONS BY VARYING THE WAFER TEMPERATURE THROUGHOUT DEPOSITION

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

Some semiconductor manufacturing processes deposit one or more layers of a material onto a semiconductor substrate or wafer. Integrated circuit fabricators and equipment designers employ various process and apparatus arrangements to produce films with properties that are desirable both during and after material deposition. Material deposition systems, such as chemical vapor deposition chambers, may be operated at different process conditions to control the overall properties of deposited material. However, defining process conditions that produce films with properties that meet many requirements remains a challenge.

SUMMARY

In one embodiment a method of depositing a material onto a substrate in a multi-station deposition apparatus may be provided. The method may include (a) providing a substrate to a first station of the multi-station deposition apparatus, (b) adjusting the temperature of the substrate to a first temperature through heat transfer between the substrate and a pedestal in the first station, (c) depositing a first portion of the material on the substrate while the substrate is at the first temperature in the first station, (d) transferring the substrate to a second station in the multi-station deposition apparatus, (e) adjusting the temperature of the substrate to a second temperature through heat transfer between the substrate and a pedestal in the second station, and (f) depositing a second portion of the material on the substrate while the substrate is at the second temperature; the first portion and the second portion may exhibit different values of a property of the material.

In some embodiments, depositing the material on the substrate while the substrate is at the first temperature may deposit the first portion of the material as a first layer having a first value of a property, and depositing the material on the substrate while the substrate is at the second temperature may deposit the second portion of the material as a second layer having a second value of the property.

In some embodiments, the property may be a first wet etch rate, a first composition, or a first density.

In some embodiments, (b) may include adjusting the temperature of the substrate to the first temperature using a heating element in a pedestal of the first station, and (e) may include adjusting the temperature of the substrate to the second temperature using a heating element in a pedestal of the second station.

In some embodiments, the method may also include (g) after (f), providing the substrate to a third station of the multi-station deposition apparatus, (h) adjusting the temperature of the substrate to a third temperature through heat transfer between the substrate and a pedestal in the third station, and (i) depositing a third portion of the material on the substrate while the substrate is at the third temperature.

In some such embodiments, the third temperature may be the first temperature, the second temperature, or a temperature that is not the first temperature or second temperature.

In some further such embodiments, the method may further include (j) after (i), providing the substrate to a fourth station of the multi-station deposition apparatus, (k) adjusting the temperature of the substrate to a fourth temperature through heat transfer between the substrate and a pedestal in the fourth station, and (l) depositing a fourth portion of the material on the substrate while the substrate is at the fourth temperature.

In some further such embodiments, the fourth temperature may be the first temperature, the second temperature, the third temperature, or a temperature that is not the first temperature, the second temperature, or the third temperature.

In some embodiments, (c) may include depositing the first portion of the material on the substrate over N1 deposition cycles, and a deposition cycle may be a set of process steps that collectively deposit a fraction of the total thickness of the layer of material deposited at a station; and (f) may include depositing the second portion the material on the substrate over N2 deposition cycles, and a deposition cycle may be a set of process steps that collectively deposit a fraction of the total thickness of the layer of material deposited at a station.

In some embodiments, (c) may include depositing the first portion of the material on the substrate for a time period of t1, and (f) may include depositing the second portion of the material on the substrate for a time period of t2.

In some embodiments, the method may further include while depositing the first portion of the material in (c), moving the substrate toward or away from a substrate support surface of the pedestal of the first station to thereby adjust a separation distance between the substrate and the pedestal and further adjust the temperature of the substrate in the first station.

In some embodiments, (b) adjusting the temperature of the substrate to the first temperature may include causing the substrate to be separated from a substrate support surface of the pedestal of the first station by a first separation distance. The method may further include after (c) and before (d), adjusting the temperature of the substrate to a third temperature by causing the substrate to be separated from the substrate support surface of the pedestal of the first station by a second separation distance, after (c) and before (d), depositing a third portion of the material on the substrate while the substrate is in the first station, at second separation distance, and at the third temperature. The third portion may exhibit different values of the property of the material than one or more of the first portion and the second portion of the material.

In some such embodiments, (e) may include adjusting the temperature of the substrate to the second temperature by causing the substrate to be separated from a substrate support surface of the pedestal in the second station by a third separation distance. The method may further include after (f), adjusting the temperature of the substrate to a fourth temperature by causing the substrate to be separated from the substrate support surface of the pedestal in the second station by a fourth separation distance, after (f), depositing a fourth portion of the material on the substrate while the substrate is at the fourth temperature and in the second station. The fourth portion may exhibit different values of the property of the material than one or more of the first portion, the second portion, and the third portion of the material.

In some other such embodiments, the first separation distance may be substantially zero such that the substrate contacts the substrate support surface.

In some other such embodiments, (e) may include causing the substrate to be separated from the substrate support surface of the pedestal by the second separation distance by moving the pedestal vertically away from the substrate while the substrate remains stationary.

In some other such embodiments, (e) may include causing the substrate to be separated from the substrate support surface of the pedestal by the second separation distance by moving the substrate vertically away from the pedestal using a lifting mechanism while the pedestal remains stationary.

In some embodiments, a multi-station deposition apparatus may be provided. The apparatus may include a processing chamber, a first process station in the processing chamber that includes a first pedestal having a first heating element configured to heat a substrate located in the first process station, a second process station in the processing chamber that includes a second pedestal having a second heating element configured to heat a substrate located in the second process station, a substrate transferring device for transferring one or more substrates between the first process station and the second process station, and a controller for controlling the multi-station deposition apparatus to deposit a material onto a substrate at different temperatures. The controller may include comprising control logic for (a) providing a substrate to the first station of the multi-station deposition apparatus, (b) adjusting the temperature of the substrate to a first temperature through heat transfer between the substrate and the first pedestal, (c) depositing a first portion of the material on the substrate while the substrate is at the first temperature in the first station, (d) transferring the substrate to the second station, (e) adjusting the temperature of the substrate to a second temperature through heat transfer between the substrate and the second pedestal, and (f) depositing a second portion of the material on the substrate while the substrate is at the second temperature. The first portion and the second portion may exhibit different values of a property of the material.

In some embodiments, each pedestal may include a substrate support surface, may be configured to cause the substrate to be contacting the substrate support surface, and may be configured to cause the substrate to be separated from the substrate support surface by a first separation distance and by a second separation distance. The controller may further include control logic for positioning the substrate at the first separation distance and at the second separation distance and performing (a) through (c), (e), and (f) at the first station of the multi-station deposition apparatus. Additionally, (b) may include adjusting the temperature of the substrate to the first temperature by causing the substrate to be separated from the substrate support surface of the pedestal of the first station by a first separation distance, (c) may include depositing the first portion of the material while the substrate is separated from the substrate support surface by the first separation distance, (e) may include adjusting the temperature of the substrate to the second temperature by causing the substrate to be separated from the substrate support surface of the pedestal of the first station by a second separation distance, and (f) may include depositing the material on the substrate while the substrate is separated from the substrate support surface by of the pedestal of the first station the second separation distance.

In some embodiments, each pedestal may include a substrate support surface, may be configured to cause the substrate to be contacting the substrate support surface, and may be configured to cause the substrate to be separated from the substrate support surface by a first separation distance and by a second separation distance. Additionally, (b) may include adjusting the temperature of the substrate to the first temperature through heat transfer between the substrate and the pedestal in the first station while the substrate is separated from a substrate support surface of the pedestal of the first station by a first separation distance. The controller may further include control logic for after (c) and before (d), adjusting the temperature of the substrate to a third temperature by causing the substrate to be separated from the substrate support surface of the pedestal of the first station by a second separation distance and after (c) and before (d), depositing a third portion of the material on the substrate while the substrate is in the first station, at second separation distance, and at the third temperature. The third portion may exhibit different values of the property of the material than one or more of the first portion and the second portion of the material.

In some embodiments, the first heating element may be a resistive heating coil embedded in aluminum or a heating wire embedded in aluminum nitride.

These and other features of the disclosure will be described in more detail below with reference to the associated drawings.

DETAILED DESCRIPTION

Figure 1:
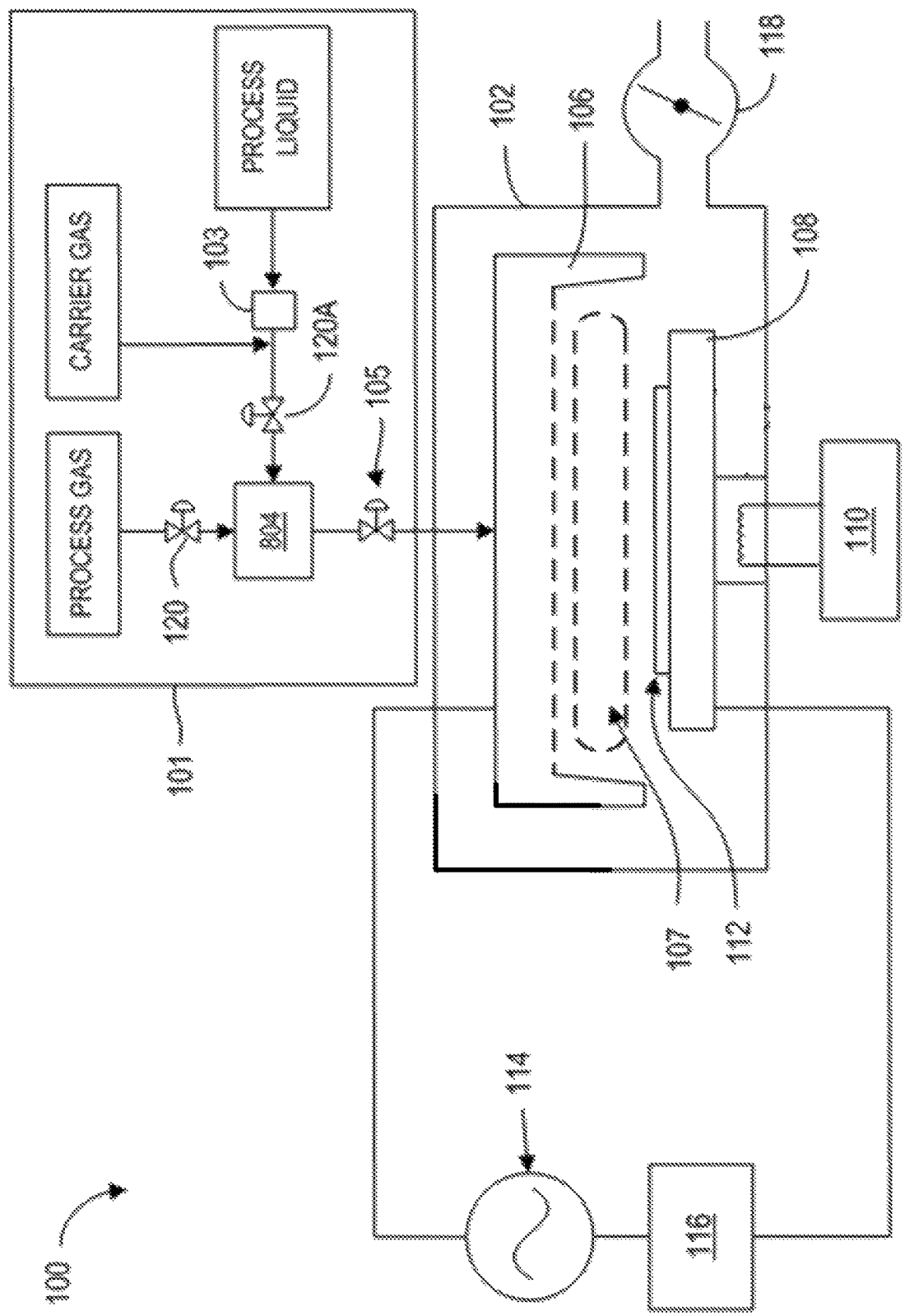
FIG. 1 depicts a cross-sectional schematic of a substrate processing apparatus having a processing chamber with a single process station.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific implementations, it will be understood that these implementations are not intended to be limiting.

There are many concepts and implementations described and illustrated herein. While certain features, attributes and advantages of the implementations discussed herein have been described and illustrated, it should be understood that many others, as well as different and/or similar implementations, features, attributes and advantages of the present inventions, are apparent from the description and illustrations. As such, the below implementations are merely some possible examples of the present disclosure. They are not intended to be exhaustive or to limit the disclosure to the precise forms, techniques, materials and/or configurations disclosed. Many modifications and variations are possible in light of this disclosure. It is to be understood that other implementations may be utilized and operational changes may be made without departing from the scope of the present disclosure. As such, the scope of the disclosure is not limited solely to the description below because the description of the above implementations has been presented for the purposes of illustration and description.

Importantly, the present disclosure is neither limited to any single aspect nor implementation, nor to any single combination and/or permutation of such aspects and/or implementations. Moreover, each of the aspects of the present disclosure, and/or implementations thereof, may be employed alone or in combination with one or more of the other aspects and/or implementations thereof. For the sake of brevity, many of those permutations and combinations will not be discussed and/or illustrated separately herein.

Disclosed herein are methods, systems, and apparatuses for performing film deposition at different temperatures in a deposition apparatus. Some semiconductor processes are used to deposit one or more layers of a material onto a substrate such as a wafer. When used herein, "wafer" can typically be interpreted to include other forms of "substrate" such as a large format display substrate. In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. However, the invention is not so limited. The work piece may be of various shapes, sizes, and materials. In addition to semiconductor wafers, other work pieces that may take advantage of this invention include various articles such as printed circuit boards and the like.

Examples of film deposition processes include chemical vapor deposition ("CVD"), plasma-enhanced CVD ("PECVD"), atomic layer deposition ("ALD"), low pressure CVD, ultra-high CVD, physical vapor deposition ("PVD"), and conformal film deposition ("CFD"). For instance, some CVD processes may deposit a film on a substrate surface within a single deposition process. Some other deposition processes involve multiple film deposition cycles, each producing a "discrete" film thickness. ALD is one such film deposition method, but any technique which puts down thin layers of film and used in a repeating sequential matter may be viewed as involving multiple cycles of deposition.

Film deposition is performed under particular process conditions, sometimes called a "recipe", which are optimized for the material being deposited and the deposition process being utilized. Some example process conditions include the timing and mixture of gaseous and liquid reactants, chamber and/or station pressure, chamber and/or station temperature, substrate temperature, target power levels, RF power levels, RF exposure time, substrate pedestal, chuck, and/or susceptor position, plasma formation in each station, and flow of gaseous and liquid reactants.

Overview of Film Deposition Apparatuses

Operations for depositing films on semiconductor substrates may generally be performed in a substrate processing apparatus like that shown in FIG. 1. The apparatus 100 of FIG. 1, which will be described in greater detail below, has a single processing chamber 102 with a single substrate holder 108 in an interior volume which may be maintained under vacuum by vacuum pump 118. The substrate holder, i.e., pedestal, 108 has a heating element 110 which may heat the pedestal and substrate. Also fluidically coupled to the chamber for the delivery of (for example) film precursors, carrier and/or purge and/or process gases, secondary reactants, etc. is gas delivery system 101 and showerhead 106. Equipment for generating a plasma within the processing chamber is also shown in FIG. 1 and will be described in further detail below. In any event, as it is described in detail below, the apparatus schematically illustrated in FIG. 1 provides the basic equipment for performing film deposition operations such as ALD on semiconductor substrates.

While in some circumstances a substrate processing apparatus like that of FIG. 1 may be sufficient, when time-consuming film deposition operations are involved, it may be advantageous to increase substrate processing throughput by performing multiple deposition operations in parallel on multiple semiconductor substrates simultaneously. For this purpose, a multi-station substrate processing apparatus may be employed like that schematically illustrated in FIG. 2. The substrate processing apparatus 200 of FIG. 2, still employs a single substrate processing chamber 214, however, within the single interior volume defined by the walls of the processing chamber, are multiple substrate process stations, each of which may be used to perform processing operations on a substrate held by a pedestal at that process station. In this particular embodiment, the multi-station substrate processing apparatus 200 is shown having 4 process stations 201, 202, 203, and 204. The apparatus also employs a substrate loading device, in this case substrate handler robot 226, for loading substrates at process stations 201 and 202, and a substrate transferring device, in this case substrate carousel 290, for transferring substrates between the various process stations 201, 202, 203, and 204. Other similar multi-station processing apparatuses may have more or fewer processing stations depending on the embodiment and, for instance, the desired level of parallel substrate processing, size/space constraints, cost constraints, etc. Also shown in FIG. 2, which will be described in greater detail below, is a controller 250 which also assists the goal of performing efficient substrate deposition operations such as in, for example, atomic layer deposition (ALD) operations.

Figure 2:
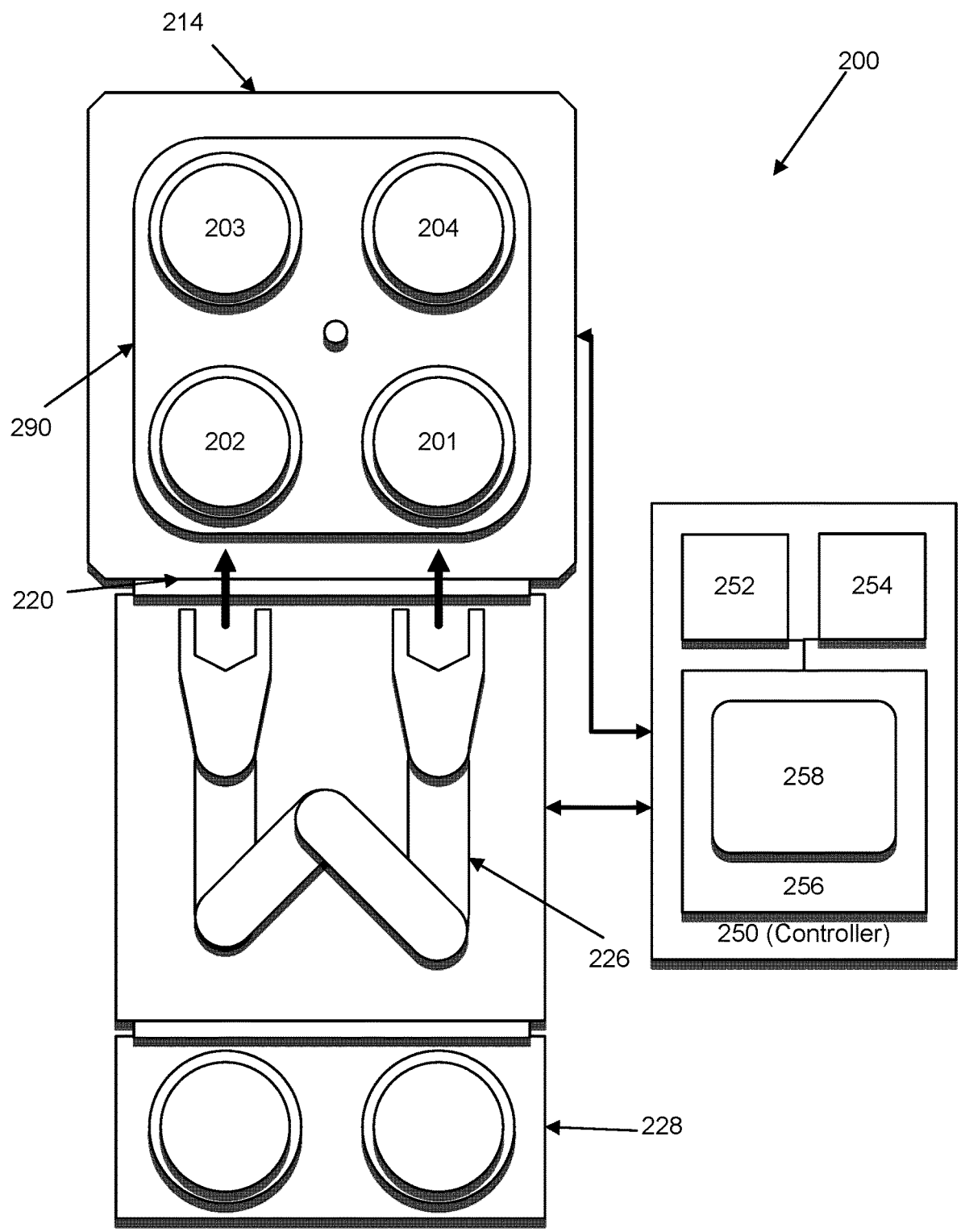
FIG. 2 depicts a schematic of a system for performing film deposition in one or more multi-station semiconductor processing tools and including a four-station substrate processing tool, a substrate handler robot for loading and unloading substrates from two process stations, and a controlling for operating the tool.

Note that various efficiencies may be achieved through the use of a multi-station processing apparatus like that shown in FIG. 2 with respect to both equipment cost and operational expenses. For instance, a single vacuum pump (not shown in FIG. 2, but e.g. 118 in FIG. 1) may be used to create a single high-vacuum environment for all 4 process stations and it may also be used to evacuate spent process gases, etc. with respect to all 4 process stations. Depending on the embodiment, each process station typically has its own dedicated showerhead for gas delivery (see, e.g., 106 in FIG. 1), but share the same gas delivery system (e.g., 101 in FIG. 1). Likewise, certain elements of the plasma generator equipment may be shared amongst process stations (e.g., power supplies), although depending on the embodiment, certain aspects may be process station-specific (for example, if showerheads are used to apply plasma-generating electrical potentials—see the discussion of FIG. 1 below). Once again, however, it is to be understood that such efficiencies may also be achieved to a greater or lesser extent by using more or fewer numbers of process stations per processing chamber such as 2, 3, 5, 6, 7, 8, 9, 10, 11, 12, 13, 14, 15, or 16, or more process stations per reaction chamber.

Overview of Film Deposition

As noted above, examples of such deposition processes include CVD, PECVD, and ALD, among others. Some CVD processes may deposit a film on a substrate surface by flowing one or more gas reactants into a reactor which form film precursors and by-products. The precursors are transported to the substrate surface where they are adsorbed by the substrate, diffused into the substrate, and deposited on the substrate by chemical reactions which also generate by-products that are removed from the surface and from the reactor.

As device and features size continue to shrink in the semiconductor industry, and also as 3D devices structures become more prevalent in integrated circuit (IC) design, the capability of depositing thin conformal films (films of material having a uniform thickness relative to the shape of the underlying structure, even if non-planar) continues to gain importance. ALD is a film forming technique which is well-suited to the deposition of conformal films due to the fact that a single cycle of ALD only deposits a single thin layer of material, the thickness being limited by the amount of one or more film precursor reactants which may adsorb onto the substrate surface (i.e., forming an adsorption-limited layer) prior to the film-forming chemical reaction itself. Multiple "ALD cycles" may then be used to build up a film of the desired thickness, and since each layer is thin and conformal, the resulting film substantially conforms to the shape of the underlying devices structure. In certain embodiments, each ALD cycle includes the following steps:

1. Exposure of the substrate surface to a first precursor.
2. Purge of the reaction chamber in which the substrate is located.
3. Activation of a reaction of the substrate surface, typically with a plasma and/or a second precursor.
4. Purge of the reaction chamber in which the substrate is located.

The duration of each ALD cycle may typically be less than 25 seconds or less than 10 seconds or less than 5 seconds. The activation step (or steps) of the ALD cycle may be of a short duration, such as a duration of 1 second or less. For some low-temperature, relatively unreactive precursors, dose and conversion times can be on the order of 1 minute or more. The plasma-enhanced ALD PEALD sequence described above can also be run with a thermal activation or conversion step when the substrate is too sensitive to tolerate impingement of the energetic species created in a plasma. One advantage of a PEALD system is to enable the use of plasmas of varying power, frequency, and ion energy to modify film surfaces, especially on the sides of high-AR features. In some cases an additional surface modification step may be added to the ALD sequence described above that can be as long as 1 minutes or more.

Film Properties

In some deposition processes, the process conditions may affect various properties of the deposited film, such as its physical and/or chemical properties. For instance, the process conditions, notably temperature, can affect the composition (e.g., chemical stoichiometry or the addition of other components, such as hydrogen), optical properties (e.g., RI and/or absorption coefficient), and/or density of a deposited film, as well as the film's breakdown voltage and electrical properties (e.g., resistivity). In many typical deposition processes, the process conditions are kept substantially constant throughout the entire film deposition process in order to provide, for instance, film uniformity, homogeneous film properties throughout the depth of the film (such as wet etch rate or dry etch rate), repeatability, and/or high throughput. However, in some deposition processes, which are the subject of this disclosure, the process conditions may be modified during the deposition such that a film is produced with a varying property, i.e., the film is a multi-layer film, such as a bilayer, trilayer, quadlayer, continuously varying layer, etc.

Figure 3:
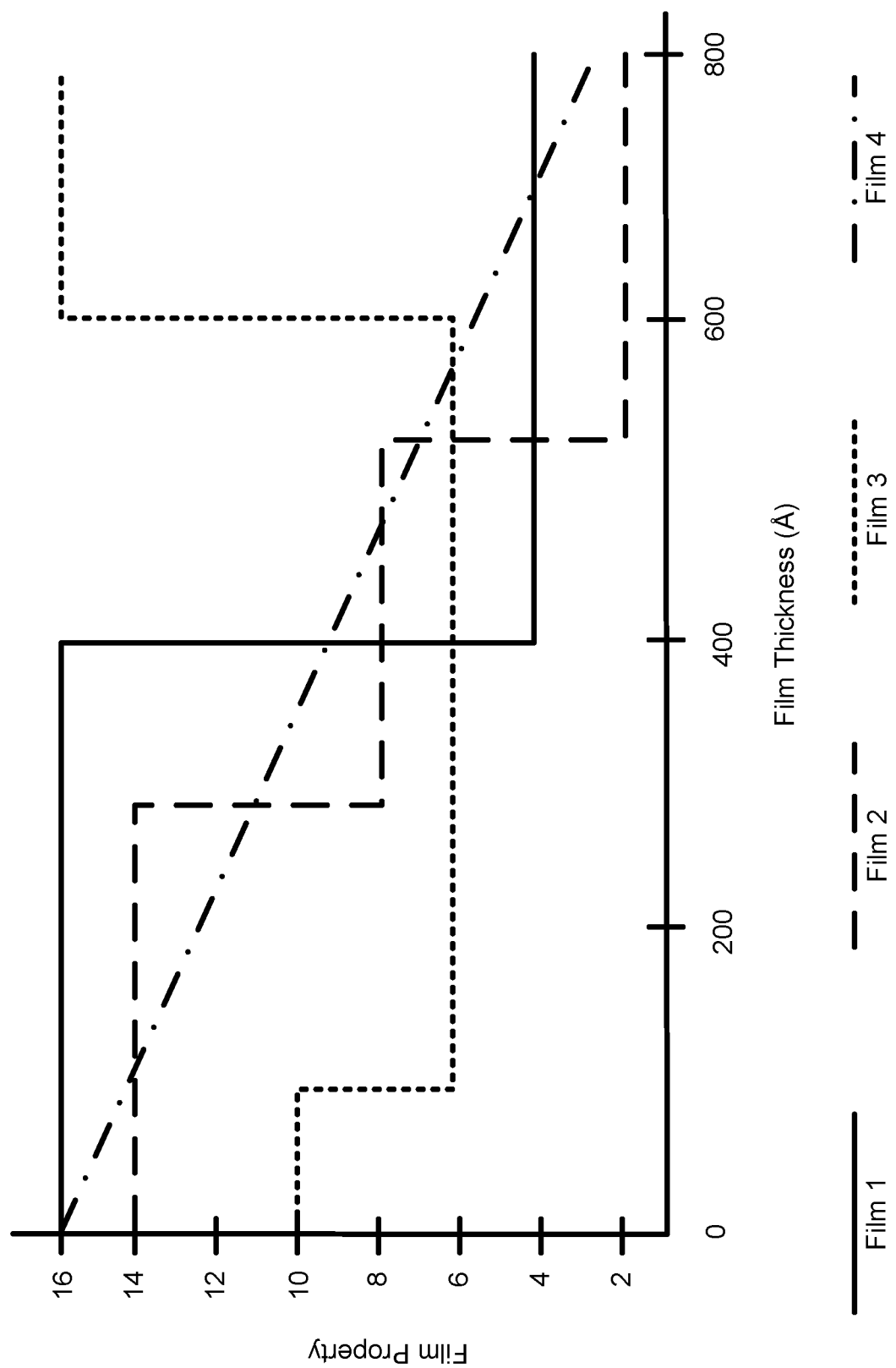
FIG. 3 depicts a representation of four films with varying values of a Film Property throughout each film.

For example, FIG. 3 depicts a representation of four films with varying values of a Film Property throughout each film. It should be understood that the Film Property in FIG. 3 is not a specific film property, but rather a representational property for illustrative purposes and the values are also only illustrative; such Film Property may represent any of the aforementioned properties, such as composition or density. The x-axis of FIG. 3 represents the full thickness of the film such that 0 is the interface between the film and a bottom surface of the substrate (e.g., the bottom of the film and the first portion of the film that is deposited on the substrate) and 800 is the top of the film (e.g., the last portion of the film that is deposited). In FIG. 3, Film 1 is a bilayer film such that the Film Property has two different values in the film thickness; the first portion of the deposited film (i.e., about half, from 0 to about 400 Å) has the Film Property at a higher value (e.g., 16) than the second portion of the deposited film (i.e., the other half, about 400 Å to 800 Å), which has a lower value (e.g., 2). The change in Film Property value of Film 1 may occur by the adjustment of one or more process conditions, such as plasma power or temperature. As discussed below, the process conditions may be changed in a variety of ways during the deposition process. Film 2 in FIG. 3 may be considered a trilayer such that the Film Property has three different values throughout the film; the first portion (i.e., 0 to about 300 Å) has the highest Film Property value, the last portion (i.e., about 550 Å to 800 Å) has the lowest Film Property value, and the intermediate portion (i.e., about 300 Å to about 550 Å) has a Film Property value in-between the first and last portions.

It should be noted that a film may have a wide-ranging number of layers with varying values, and the portions of each film with a given Film Property value may also be unevenly distributed within a film thickness (e.g., ⅓ of the film at one Film Property value and ⅔ of the film at a different Film Property value). For instance, Film 3 in FIG. 3 depicts the first ⅛ of the film thickness has a particular Film Property value (e.g., 8), the next ⅝ of the of the film thickness have a lower Film Property value (e.g., 6), and the last ¼ of the film thickness has a Film Property value higher than the other two portions, (e.g., 16). Film 3 may also be considered a trilayer film, but with three uneven layers of the film thickness having different Film Property values.

The value of the Film Property throughout a film may also vary continuously, as exemplified by Film 4 in FIG. 3. The Film Property of Film 4 begins at the highest value and varies continuously (e.g., in a linear fashion) to a lowest value of about 3 Å at the top, or end, of the deposited film. Such a continuous variation is not limited to a linear variation, but may be non-linear (e.g., exponential) as well as having both linear and non-linear variations.

The examples of FIG. 3 illustrate that a film thickness may be configured to have multiple layers or portions that each have a different value of a particular film property. The number of portions of a layer, values of each portion, and variation between portions may be configured in any number of ways that may be desirable for a particular process.

Some semiconductor processes that include depositing a film onto temperature-sensitive substrates may benefit from the film having varying film properties (such as different densities or wet etch rate ("WER")) throughout the thickness of the film. For example, in the production of dynamic random-access memory (DRAM) applications (DRAM being a type of some random-access memory that stores a bit of data in a separate capacitor within an integrated circuit), deposition processes are used to produce a tungsten bitline spacer which involves, among other things, the deposition of a silicon nitride film on top of tungsten. Such a deposition process is temperature-sensitive because at higher deposition temperatures, such as 650° C., the silicon nitride film is deposited with chemistry that can react with the tungsten to produce tungsten nitride; the resulting tungsten nitride has a higher resistivity than tungsten and is therefore undesirable in many DRAM applications. Thus, it is desirable that the deposition at this substrate-film interface, e.g., silicon nitride-tungsten, produces little to no reaction between the two materials at the interface; this may be accomplished by changing a process condition in order to produce a film with a particular chemical composition that does not react, or has a low reaction rate, with the surface of the substrate onto which the film is deposited. It may also be accomplished by changing a process condition such that the reaction rate between the two is held at a low or nominal rate. In this example, the low reaction rate between silicon nitride and tungsten may be achieved by depositing the film at a low temperature which may be between about 100° C. and 300° C., including at about 250° C.

It may also be desirable for the deposited silicon nitride film in DRAM processing to have film properties that enable the film to be stable when exposed to subsequent processing steps, such as etching or acidic cleaning. For instance, a silicon nitride film with a lower WER may better protect the film from such subsequent processing steps. As discussed below, a film with a lower WER may be produced by higher deposition temperatures. Accordingly, it may be desirable to deposit the silicon nitride film onto the tungsten at a lower temperature in order to suppress the chemical reaction between the silicon nitride and tungsten at their interface and also desirable to deposit the silicon nitride at a higher temperature in order to produce a lower WER. Therefore, this silicon nitride deposition may benefit from different deposition temperatures during the deposition process, such as a lower temperature at the beginning of the process and a higher temperature at the end of the process.

In another example, in phase change random-access memory (PCRAM), chalcogenide memory elements used in PCRAM may be subject to degradation (e.g., chemical and/or morphological) when exposed to reactants at about 250° C. or higher. In some such PCRAM processing, it is desirable to deposit a chalcogenide-encapsulating layer, but the temperature at which deposition occurs may adversely affect the chalcogenide. Therefore, it is desirable to deposit the initial portions of the encapsulating layer at temperatures at or below 250° C., after which the remaining portions of the layer, or other layers, may be deposited at higher temperatures.

However, many current deposition processes and apparatuses, such as a single station deposition apparatus, do not have the ability to adjust the temperature throughout a deposition process in an effective and/or manufacturable way. For instance, some deposition apparatuses may vary the temperature during a deposition process by increasing or decrease the temperature at a given station which may be a time consuming process (e.g., waiting minutes or hours for a substrate to heat and/or cool) that causes an unacceptable decrease in throughput and/or may cause material to flake off and contaminate the substrate (e.g., film grown on the walls and/or substrate may flake off during cooling). Therefore, a single temperature is typically selected to produce a film with compromised, suboptimal film properties for the different requirements but that partially meets such requirements or produces a film that satisfies only one of the different requirements. In the DRAM silicon nitride film deposition example above, a temperature may be selected to deposit a film that is not optimally suited for either the substrate-interfacial requirements or the subsequent processing requirements, but rather is selected to partially satisfy both requirements.

The present disclosure presents inventive methods, apparatuses, and systems to adjust the deposition temperature during a deposition process to change one or more properties of a deposited film.

Deposition Techniques with Varying Temperatures

Figure 4:
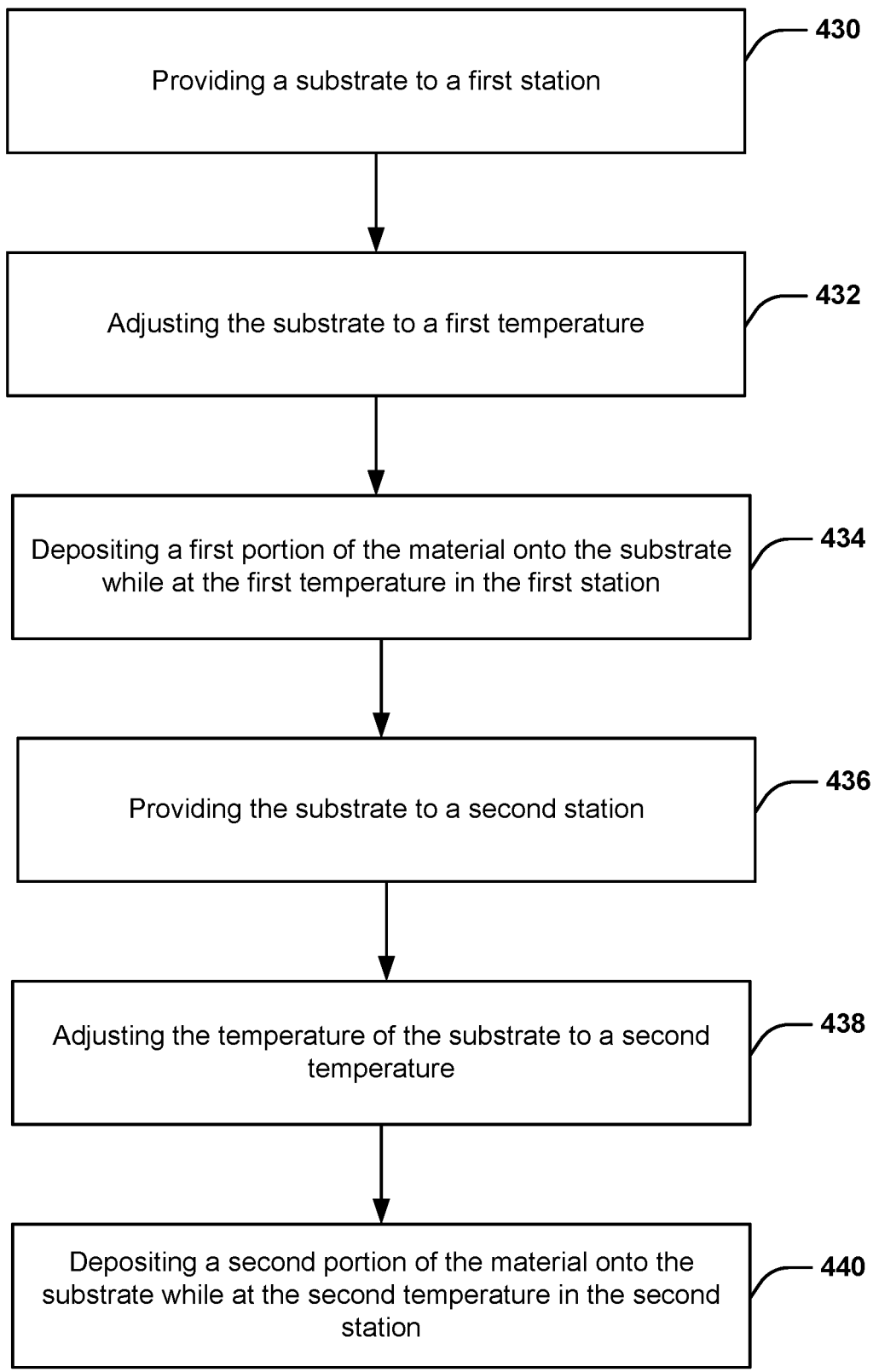
FIG. 4 depicts a flowchart for an example technique for depositing a material on a substrate at various temperatures in a multi-station deposition apparatus.

FIG. 4 depicts a flowchart for an example technique for depositing a material on a substrate at various temperatures in a multi-station deposition apparatus. As can be seen in block 430, a substrate may be provided to a first processing station (i.e. "station") of a multi-station deposition apparatus. Each station of the multi-station reactor may have a pedestal and each pedestal may have a substrate support surface that is configured to support a substrate. In some embodiments, the substrate may be provided to the first station and onto the substrate support surface such that it is contacting the substrate support surface while in some other embodiments, the substrate may be placed onto a lifting mechanism, e.g., lift pins, of the pedestal such that the substrate is separated from, e.g., above, the substrate support surface by a non-zero distance.

In block 432, the temperature of the substrate is adjusted to a first temperature. This adjustment may be a heating or a cooling of the substrate and may be performed by heat transfer between the substrate and the pedestal. The pedestal may include a heating element that may generate heat that may be transferred through the pedestal and to the substrate to heat and/or cool the substrate. The heating element, as discussed below, may be any known heating element in the art, such as a resistive heating coil that generates heat at a single or varying temperature based on a current flowed through the coil. The temperature of the substrate may be cooled in various ways, such as by increasing a separation distance between the substrate and the substrate support surface of the pedestal, a coolant fluid flowing through the pedestal, and/or a gas being flowed onto the substrate.

In block 434, once the substrate is heated to the first temperature, a portion of the material is deposited onto the substrate while the substrate is at the first temperature. This deposition process at the first temperature may cause, at least in part, the portion of the deposited material (i.e., a portion of the deposited film), to have at least one property with a first value, and in some embodiments multiple properties each having first values. The property may be one of those discussed above, such as composition, density, and/or WER for which the characteristics and/or values are driven, at least in part, by the first temperature. For instance, a first temperature of about 250° C. may produce a portion of the layer of material having a property, such as a WER, with a first value, such as about 900 Å/min, while a first temperature of about 400° C. may produce a portion of the material having a first property that is a WER with a value of about 100 Å/min.

As discussed above, in some processing applications it is desirable to reduce the reaction between the first portion of the deposited material (e.g., the first portion of the layer of material) and the surface onto which the first portion of the material is deposited (e.g., the substrate or other processed material on the substrate). Therefore, depositing the first portion of the material onto the substrate while at the first temperature may reduce the reactions between the material and the surface onto which the material is being deposited. In some embodiments, this may be considered a material with properties, such as composition, at first values that cause little to no reaction with the surface onto which the material is deposited. Referring to the examples above, the properties (or property) with the first values (or first value) may therefore prevent or reduce the reaction between silicon nitride and tungsten in DRAM processing, as well as prevent or reduce degradation of the chalcogenide memory elements when depositing the chalcogenide-encapsulating layer in PCRAM processing.

In block 436, after deposition in the first station, the substrate is provided to a second station of the multi-station deposition apparatus. The substrate may be moved to the second station by a substrate handling robot and the substrate may be placed onto a substrate support surface of a pedestal in the second station or onto a lifting mechanism, e.g., lift pins, of the pedestal of the second station such that the substrate is separated from, e.g., above, the substrate support surface by a non-zero distance. Once in the second station, the temperature of the substrate is adjusted to a second temperature, as seen in block 438. Like in 432, this adjustment may be a heating or a cooling of the substrate through heat transfer between the substrate and the pedestal in the second station. Once at the second temperature, in block 440 a second portion of the material is deposited onto the substrate while at the second temperature. This deposition of the second portion at the second temperature may cause the second portion to have at least one of the same properties of the first portion of the material, but the second portion exhibits a different value of the property than the first portion. For instance, if the first temperature is about 250° C., then deposition of a first portion of the material at this temperature may produce the first portion with a first property, a WER, at a first value of about 900 Å/min, and if the second temperature is about 400° C., then deposition at this temperature may produce a second portion of the material having a second value of the WE of about 100 Å/min.

The example technique of FIG. 4 is described with respect to only two stations but such technique may be used with any number of stations. For instance, in a multi-station deposition apparatus with four stations, after block 440, the substrate may be provided into the third station, adjusted to a third temperature (i.e., by heating or cooling the substrate), and have a third portion of material deposited onto the substrate while at the third temperature in the third station thus causing the third portion to have a third value of the property. Depending on, at least in part, the value of the third temperature, the third value of the property may be different than the first and second values of the property, or it may be the same as either the first or second values of the property (e.g., if the third temperature is the same as the first temperature, the third value of the property may be the same as the first value of the property).

Following this, the substrate may be provided to a fourth station, adjusted to a fourth temperature, and have a fourth portion of material deposited onto the substrate while at the fourth temperature in the fourth station thereby causing the fourth portion to have a fourth value of the property. Similar to the third portion, the fourth value of the property may be different than the first, second, or third value of the property, or may be the same as one of the first, second, or third value of the property depending on, at least in part, the value of the fourth temperature (e.g., if the fourth temperature is the same as the second temperature, then the fourth value of the property may be the same as the second value of the property).

Accordingly, in some implementations using a multi-station deposition apparatus with at least three stations, at least two stations may have the same temperature while one or more other stations have a different temperature. For instance, in the four station example above, the first temperature, the second temperature, and the fourth temperature may all be different temperatures, but the third temperature may be substantially identical to the first temperature thereby causing the first and third portions to have substantially the same value of the property. In this example, the technique may be augmented such that the substrate is provided in the third station, adjusted to the first temperature, and has a third portion of material deposited onto the substrate at the first temperature in the third station thereby causing the material to have the first value of the property. This may therefore create a quadlayer film with the first and third portions of the film having the same value of the property while the second and fourth portions have values of the property different from each other and different from the first and third portions. This example is not limited to just the first and third stations, but rather any combination of stations with similar and/or different temperatures may be configured for a particular deposition process.

The temperature of the substrate may be adjusted in various ways. In the example implementation of FIG. 4, the temperature of the substrate is adjusted by moving the substrate between stations set at different temperatures. In some embodiments, the temperature of the substrate may be adjusted by changing the separation distance between the substrate and the pedestal. For example, for a pedestal at a set temperature, a substrate placed on a substrate support surface of the pedestal may be caused to be heated to substantially the same temperature as the set temperature (e.g., within about 5 to 10%) of the pedestal. However, the temperature of the substrate is reduced as it is separated farther from the substrate support surface of the pedestal, e.g., the greater the separation distance, the greater the temperature difference between the substrate and the set temperature of the pedestal. Such separation may enable fine tuning and temperature adjustment of a substrate's temperature during and throughout a deposition process. For example, the pedestal may be set to a temperature of about 300° C. and the separation distance between the substrate and the substrate support surface of the pedestal may enable temperature adjustment of the substrate from about 300° C. to about 250° C., or lower, with the ability to adjust the temperature at about 200° C.

The pedestal may cause a separation between a substrate support surface and a substrate in a variety of ways. For example, some pedestals include lift pins which are configured to extend through and beyond the substrate support surface such that the substrate is raised vertically above the substrate support surface. The lift pins may be configured to be, at times, recessed below the substrate support surface (i.e., a "recessed position") such that a substrate may be substantially supported directly on and by the substrate support surface. In some embodiments, the pedestal remains stationary while the lift pins and substrate move vertically (vertically with respect to the substrate support surface) and in some embodiments, the pedestal moves vertically while the lift pins and substrate remain stationary.

The distance by which the lift pins and/or pedestal move may vary. For instance, the movement by the lift pins and/or pedestal may cause the separation distance to range between about 1 mil and about 1 inch, for example. The vertical movement of lift pins and pedestals may be accomplished by stepper motors which enable movement over relatively small and large incremental and total distances. For example, some lift pins may be movable at increments as small as about 5 mil and have a total range of about 1 inch; some pedestals may also be movable at increments as small as about 5 mil with a total range of about 1 inch. This enables the temperature of the substrate to be finely tuned.

Figure 5:
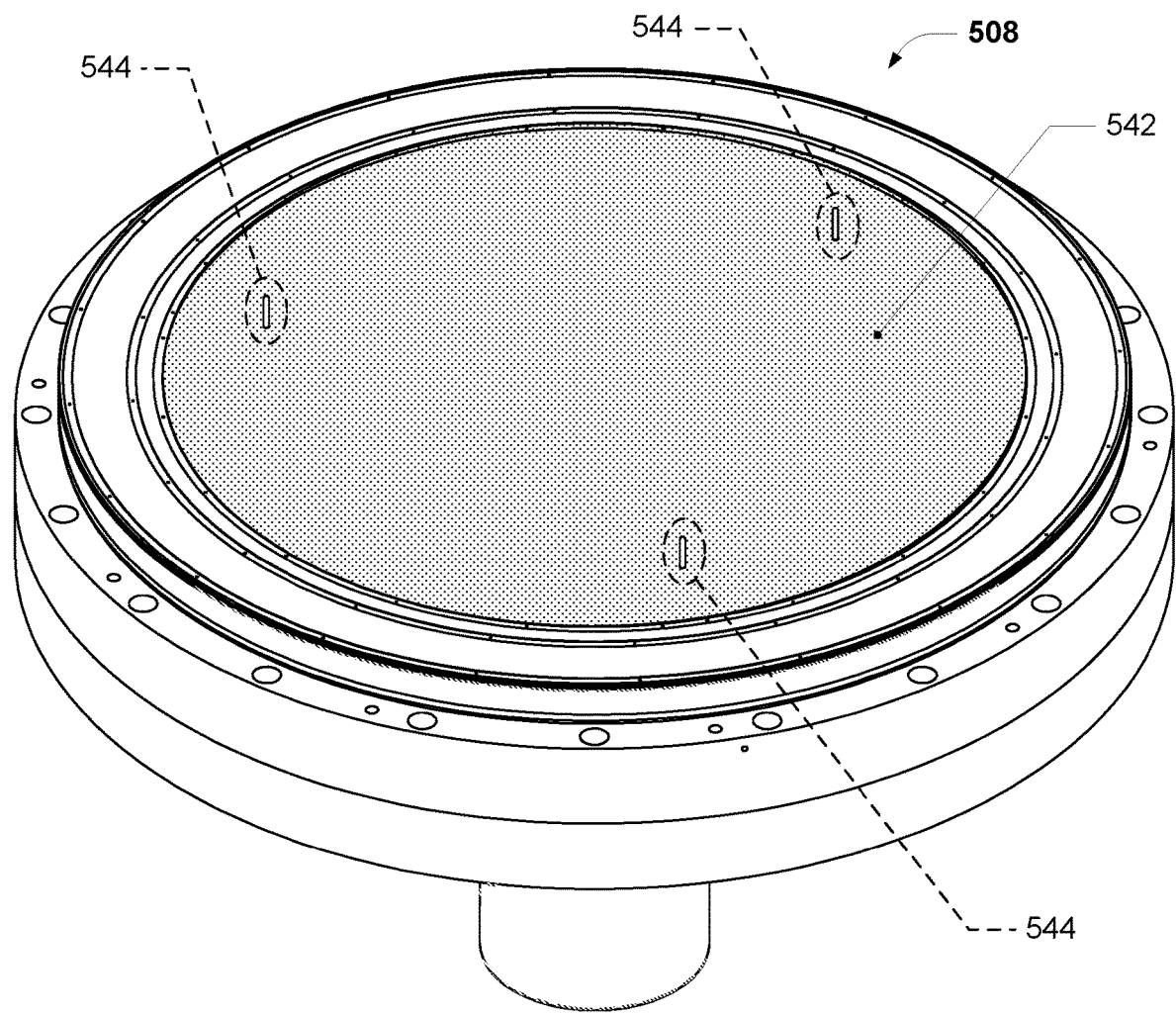
FIG. 5 depicts an isometric view of an example pedestal.
Figure 6:
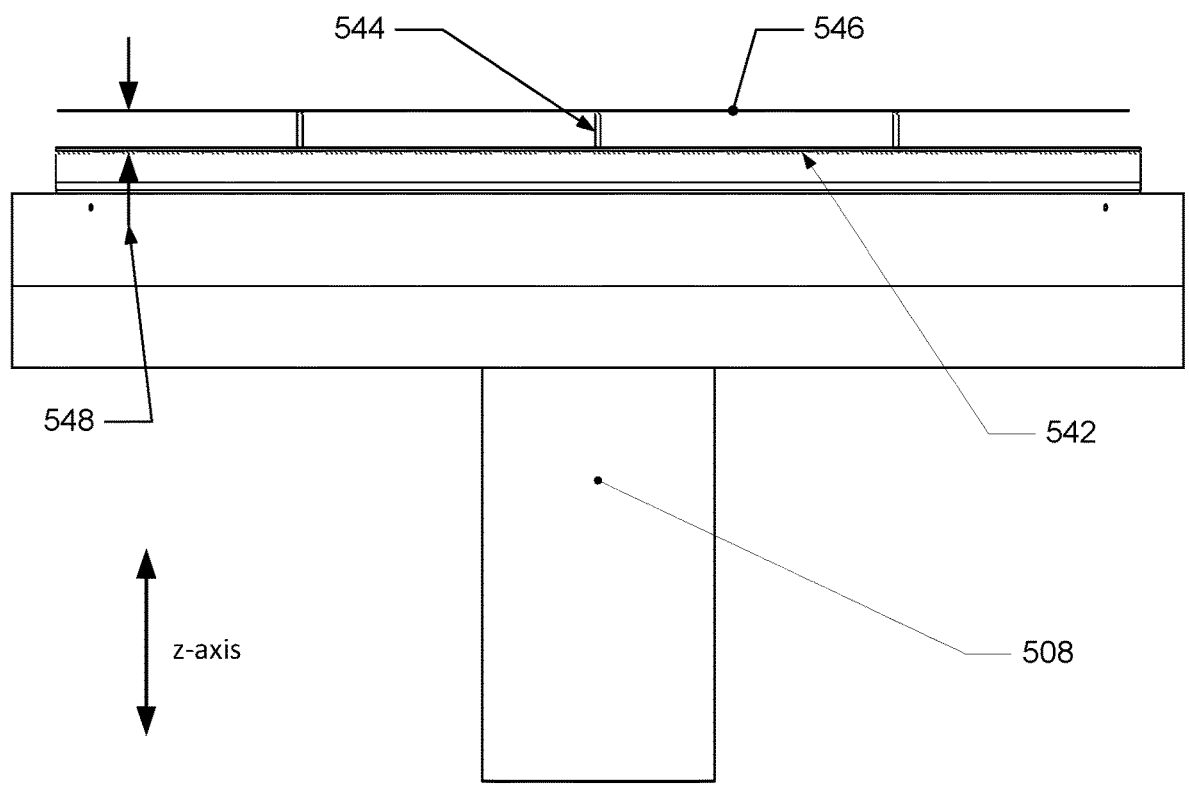
FIG. 6 depicts a side view of the example pedestal of FIG. 5.
Figure 7:
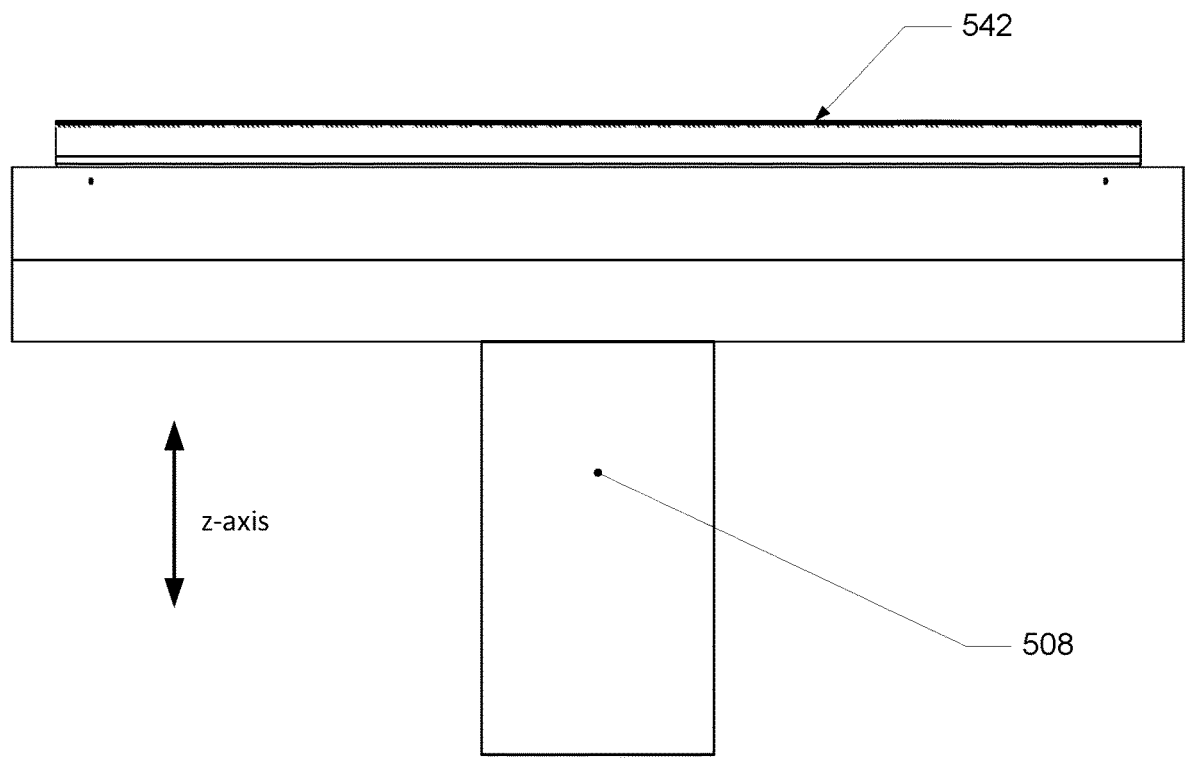
FIG. 7 depicts a side view of the example pedestal of FIG. 5 with the lift pins in a retracted position.

FIG. 5 depicts an isometric view of an example pedestal. As can be seen, pedestal 508 includes a substrate support surface 542, identified with light shading, and three lift pins 544, identified within the dashed ellipses. The lift pins 544 are seen in an extended position such that they extend past the substrate support surface. FIG. 6 depicts a side view of the example pedestal of FIG. 5. Here, the lift pins 544 are seen extending past the substrate support surface 542 in the vertical, or z-axis, direction. A substrate 546 is also seen in FIG. 6 and is located on the three lift pins 544 such that the substrate 546 is elevated above, with respect to the z-axis, and therefore separated from the substrate support surface 542 by a separation distance 548 that is in-between the vertical arrows at the left of FIG. 6. The separation distance 548 in FIG. 6 is depicted as a non-zero distance, but this separation distance 548 may be considered zero when the substrate is located on and supported by the substrate support surface 542 which may occur when the lift pins 544 are located below the substrate support surface 542 (e.g., in the recessed position). FIG. 7 also depicts a side view of the example pedestal of FIG. 5 with the lift pins in a retracted position. Unlike, FIG. 6, the lift pins of pedestal 508 have been retracted in FIG. 7. Therefore, the top-most surface of the pedestal 508 is the substrate support surface 542 such that a substrate placed on the pedestal 508 is contacting the substrate support surface 542. Accordingly, the separation distance for a substrate placed on (e.g., contacting) the substrate support surface 542 of pedestal 508 in FIG. 7 is zero.

As noted above, the separation distance between the substrate and the substrate support surface may be caused by the lift pins and the substrate moving vertically upwards in the z-axis while the pedestal remains stationary, by the lift pins and the substrate remaining stationary in the z-axis while the pedestal moves vertically down in the z-axis, or by a combination of the two.

Figure 8:
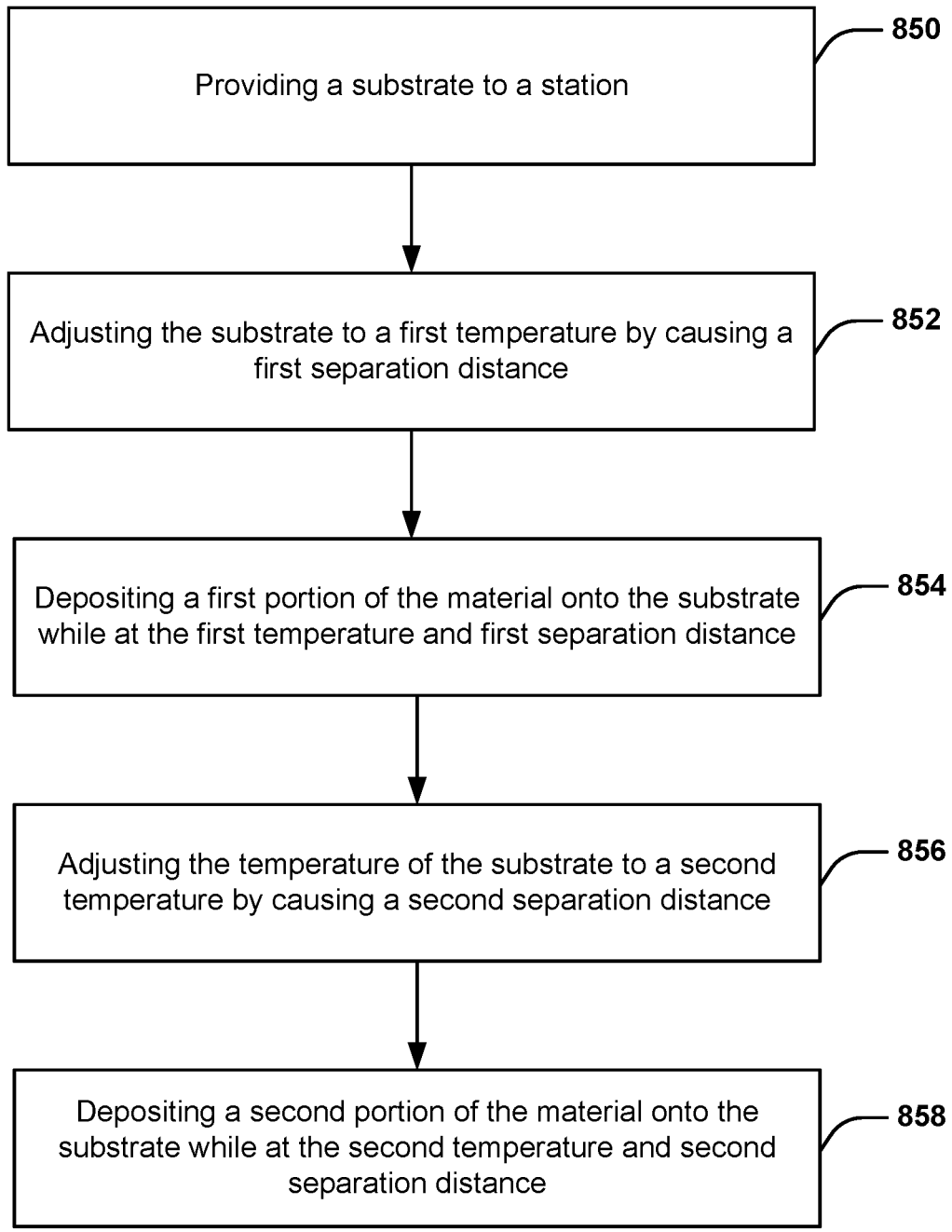
FIG. 8 depicts a flowchart for an example technique for depositing a material on a substrate at various temperatures.

Accordingly, techniques of the present disclosure may adjust the temperature of the substrate by causing the substrate and a substrate support surface of a pedestal to be separated by various distances. FIG. 8 depicts a flowchart for an example technique for depositing a material on a substrate at various temperatures. As will be described herein, in some embodiments, the example technique depicted in FIG. 8 may be an augmented technique of FIG. 4 that is performed in a single station with one or more of the temperature adjustments occurring by causing the separation distance between the substrate and the substrate support surface to change and not by moving the substrate between stations. In block 850, the substrate is placed in a station of the deposition apparatus, similar to block 430. When the substrate is placed into the station, it may be placed onto a substrate support surface of the pedestal in the station such that it the substrate is contacting the substrate support surface, or it may be placed onto a lifting mechanism, e.g., lift pins that are extending past the substrate support surface of the pedestal, such that a non-zero separation distance exists between the substrate and the substrate support surface.

In block 852, the temperature of the substrate is adjusted to the first temperature by causing the substrate and the substrate support surface of the pedestal to be separated by a first separation distance. In some embodiments, the separation distance may be zero such that, as discussed above, the substrate is contacting the substrate support surface. In other embodiments, the first separation distance may be a non-zero value.

In some embodiments, the adjustment of 852 may occur as part of providing the substrate to the station in block 850 such that the substrate is at the first separation distance once it is positioned into the station. For instance, for a first separation distance of zero, this may occur by placing the substrate directly onto the substrate support surface. In some other embodiments, the substrate may be provided to the station and then adjusted or positioned to the first separation distance; e.g., a step of adjusting the substrate to the first separation distance. For example, the substrate may be placed directly onto the substrate support surface so that the distance between the substrate and the substrate support surface is zero, after which the lift pins may be extended vertically upwards (or the pedestal may move vertically downwards) such that the substrate and substrate support surface are separated by a non-zero first separation distance. The placement of the substrate into the station may also be in the reverse order such that the substrate is initially placed into the station directly onto extended lift pins and then raised or lowered to the first separation distance which may be the initial distance at placement into the station, a higher or lower non-zero value, or zero.

In block 854, once the substrate is positioned at the first separation distance from the substrate support surface of the pedestal, deposition of the first portion of the material may occur on the substrate while at the first temperature and/or at the first separation distance. Similar to above, this deposition at the first temperature will cause the first portion of the layer to have a first property at a first value. As noted above, blocks 850 through 854 may be similar to blocks 430 to 434 of FIG. 4.

However, in the technique of FIG. 8, the substrate remains at the first station for the additional blocks 856 and 858; block 436 of FIG. 4 is omitted in FIG. 8. After the deposition in 854, the temperature of the substrate is adjusted in block 856 by causing the substrate to be separated from the substrate support surface of the pedestal by a second separation distance. As stated above, this separation may be caused by raising or lowering the lift pins while the pedestal remains stationary, raising or lowering the pedestal while the lift pins and substrate remain stationary, or a combination of the two; the second separation distance may also be zero or a non-zero value. This may also be described as adjusting the position of the substrate to the second separation distance by adjusting the position of the pedestal and/or lift pins; such adjustment causes the temperature of the substrate to change because the substrate is closer to or farther from the heated pedestal. This adjustment of 856 differs from 438 in that the adjustment of 856 occurs while the substrate remains at the same station.

Similar to 854, once the substrate is at the second temperature and at the second separation distance, a second portion of the material may be deposited onto the substrate in block 858. Such deposition may produce the second portion of the material with a second value of the property, like described above in FIG. 4.

The technique exemplified in FIG. 8 may be repeated and/or modified in order to cause the substrate to be heated to more than two temperatures while remaining at the same station by separating the substrate from the substrate support surface by more than two separation distances to produce a film with more than two portions that have different values of the property. Additionally or alternatively, the technique in FIG. 8 may be repeated in order to cause the substrate to be heated to the first temperature and/or second temperature more than one once (i.e., by causing the substrate to be separated from the substrate support surface by the first and/or second separation distance, respectively) in order to produce more than one layer having first properties and/or second properties, respectively.

Accordingly, for example, after block 858, the temperature of the substrate may be adjusted to a third temperature by causing the substrate to be separated from the substrate support surface by a third distance. Following this adjustment, a third portion of the material may be deposited while the substrate is at the third temperature and/or the third distance such that the third portion has a third value of the property. As described above, depending on the process conditions of the third portion, such as the deposition temperature, the third value may be different from or the same as the first or second value of the property.

The techniques described herein may also be combined with each other. In some embodiments a technique for depositing material onto a substrate in a multi-station deposition apparatus may adjust the temperature of the substrate by using two or more stations at different temperatures and two or more separation distances between the substrate and the substrate support surface of a pedestal in a station.

Figure 9:
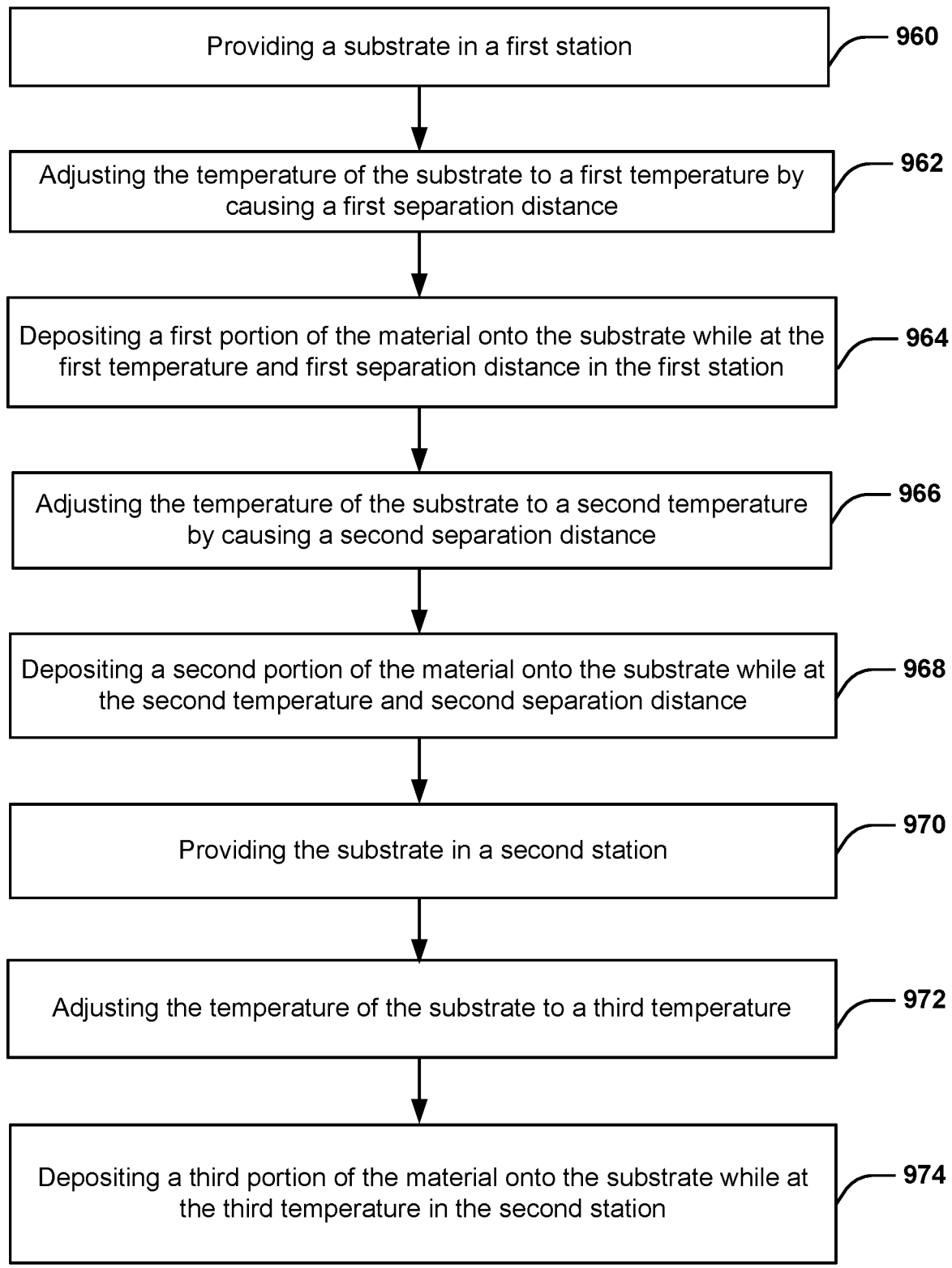
FIG. 9 depicts a flowchart for an example technique for depositing material onto a substrate at different temperatures in a multi-station deposition apparatus.

FIG. 9 depicts an example technique for depositing material onto a substrate at different temperatures in a multi-station deposition apparatus. Blocks 960 through 968 may be the same as blocks 850 through 858, respectively, such that two portions of the material are deposited onto the substrate while the substrate is at two different temperatures on the pedestal in the first station; the substrate is heated to the different temperatures by adjusting the separation distance between the substrate and the substrate support surface of the pedestal in the first station. Blocks 962 and 964 deposit the first portion of material with a first value of the property that is different than the second portion with the second value of the property that is deposited in blocks 966 and 968.

After block 968, in block 970 the substrate is provided into a second station of the multi-station deposition apparatus, like in block 436. Blocks 970 through 974 may be similar to blocks 436 through 440, but here in FIG. 9 the temperature of the substrate is adjusted to a third temperature at the second station. In some embodiments, the temperature of the pedestal in the second station is different than the temperature of the pedestal of the first station. Accordingly, when the substrate is placed into the second station, it is heated or cooled to the third temperature which is different than the first and second temperatures. A third portion of the material is then deposited onto the substrate while at the third temperature in the second station which produces the third portion with a third value of the property of the material, similar to described above.

Although not shown in FIG. 9, following the deposition of block 974, the temperature of the substrate may be adjusted to a fourth temperature while at the second station by the adjustment of the separation distance between the substrate and a substrate support surface of the pedestal in the second station. This may be performed similar to blocks 960 through 968, but in the second station. For example, after and/or when the substrate is placed in the second station, the temperature of the substrate may be adjusted to the third temperature at a third separation distance between the substrate and the substrate support surface of the pedestal in the second station (this may be similar to block 960). As noted above, the third separation distance may be a zero or non-zero value. The deposition is then performed while the substrate is at the third separation distance to produce a third portion of the material with a third value of the property. Following this deposition, the temperature of the substrate may be adjusted to a fourth temperature by causing the substrate to be separated from the substrate support surface of the pedestal of the second station by a fourth separation distance. Deposition is then performed while the substrate is at this fourth temperature and fourth separation distance to produce a fourth portion of the material with a fourth value of the property, similar to described above.

In some embodiments, the technique described in FIG. 9 may not occur in the same order or with the same steps. For example, blocks 960 through 964 may occur initially, after which the substrate may then be provided into the second station (e.g., block 970 occurs) in which blocks 966, 968, 972, and 974 occur at the second station.

Additionally, in some embodiments and as described herein, while depositing the first portion of the material the substrate may be moved toward or away from the substrate support surface of the pedestal of the station to thereby adjust the separation distance between the substrate and the pedestal and further adjust the temperature of the substrate in the first station.

The deposition processes utilized for the techniques and implementations of this disclosure may be any known deposition process, such as CVD and ALD (including plasma and thermally driven processes). For example, in some CVD deposition apparatuses, each of the depositions in the techniques described herein may by a CVD deposition process at the given temperature (e.g., second temperature) that produces a film of material.

In some ALD processes, the depositions in the techniques described herein may be an entire ALD deposition process and/or particular cycles of a single deposition process. There are a great number of combinations of temperatures and deposition cycles that can be performed. For instance, a particular number of deposition cycles, including only one cycle, may occur at a particular temperature within the multi-station deposition apparatus. In a multi-station ALD apparatus with four stations, for example, the apparatus may be configured to enable deposition at two, three, or four different temperatures and the substrate may be processed at each of the four stations for any number of cycles over the ALD process. For instance, ¼ of the cycles of the total ALD process may occur at each station such that a quadlayer of material is deposited that has at least four values of the property of the material caused by being deposited at each of the different temperatures. In another example, referring back to FIG. 4, the deposition of the material at the first temperature in block 434 may occur for N1, deposition cycles, which may be any number of cycles of the total ALD deposition process; similarly, the deposition of block 440 may occur for N2 deposition cycles, which also may be any number of cycles. The depositions are also not limited to an equal number of depositions at each station or each temperature, but may vary depending on the desired properties of the deposited material. As discussed herein, a deposition cycle may be a set of process steps that collectively deposit a fraction of the total thickness of the layer of material deposited at a station.

Additionally, the temperature of the substrate at each station may be further adjusted to more than four temperatures by increasing or decreasing the separation distance between the substrate and the substrate support surface as described above such that a substrate may remain at one station but be heated to two or more temperatures and undergo depositions at the two or more temperatures at the same station.

In some embodiments, the deposition at the first temperature and at the second temperature may also occur under different process conditions in addition to different temperatures, such as different times, plasma exposure times, plasma powers, reactant exposure times, and plasma frequencies, for example.

The temperatures described herein may vary between any number of desirable temperatures for the particular deposition process. In some embodiments, the temperatures may range from about 50° C. to about 635° C., from about 150° C. to about 500° C., and from about 250° C. to about 450° C., for instance. The adjustments between temperatures at which deposition occur may be increases and/or decreases in temperature. For instance, the temperatures may change from hot to cold, cold to hot, hot to cold to hot, cold to hot to cold, generally speaking. "Hot" and "cold" as used herein are relative terms intended to provide general description of temperatures that are hotter and cooler than each other.

EXAMPLES

Figure 10:
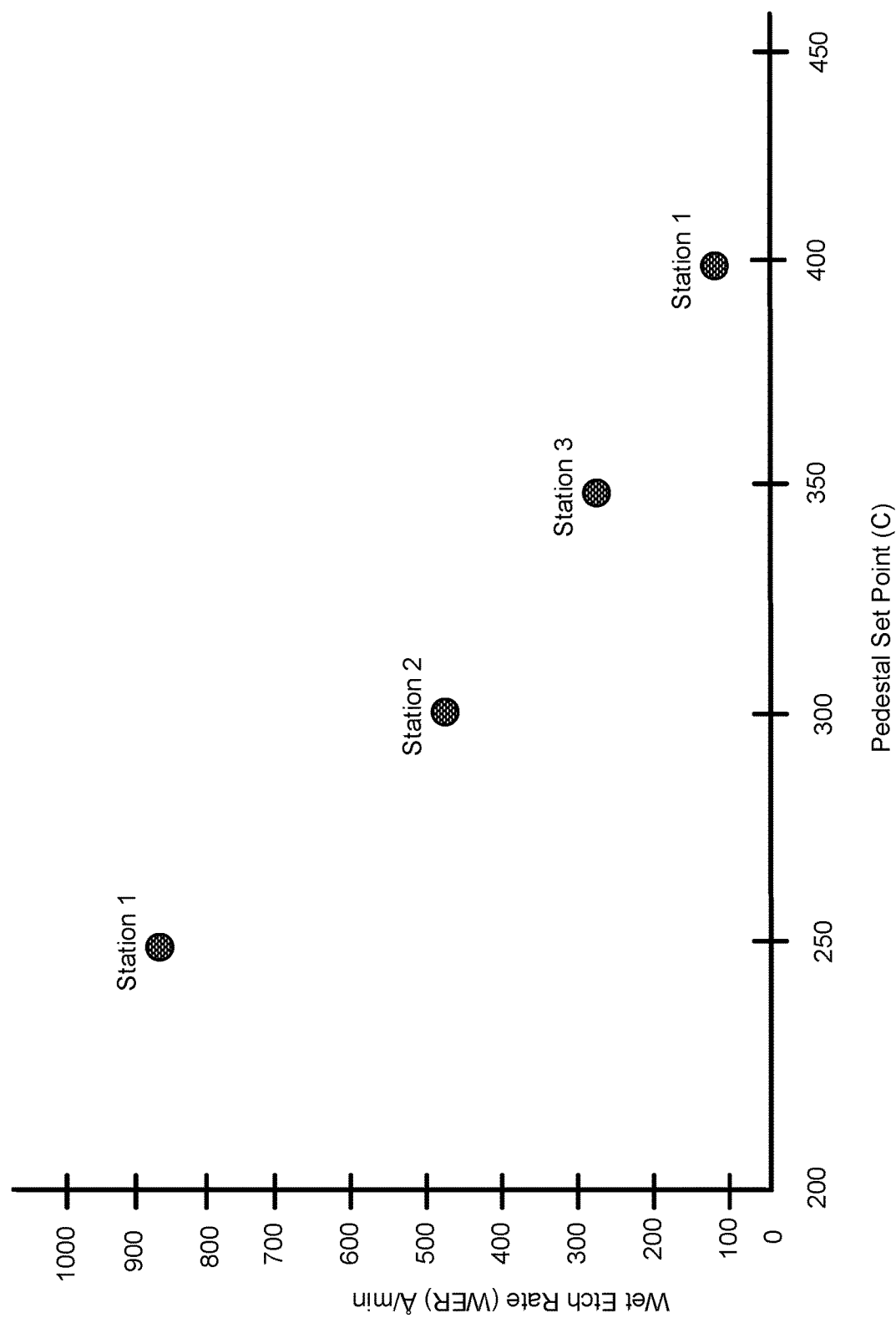
FIG. 10 depicts a chart showing the difference in wet etch rate of a film produced at different temperatures.

As noted above, depositing a material onto a substrate at different temperatures produces a film having different properties at different portions of the film that are produced at each of the different temperatures. FIG. 10 depicts a chart showing the difference in wet etch rate of a film produced at different temperatures. The x-axis of the chart in FIG. 10 represents the pedestal temperature and the y-axis represents the wet etch rate (WER), which is a property of the film. The same number of deposition cycles was performed at each station and as can be seen in FIG. 10, the WER if the film decreased as the deposition temperature increased.

The techniques and apparatuses disclosed as part of this disclosure may be utilized in various processing applications. For example, any of these techniques may be used in the deposition of a spacer on a tungsten bitline of DRAM, such as the technique of FIG. 4 which is discussed herein below. The spacer material for a DRAM manufacturing process may be any suitable material for such application, such as silicon nitride, silicon carbonitride, and silicon oxynitride. For deposition of a spacer on a tungsten bitline of DRAM, in block 430 the substrate may be provided to a first station of a multi-station deposition apparatus. In block 432, the temperature of the substrate is adjusted to a first temperature. Here, the first temperature may be a temperature that reduces or prevents a reaction between the spacer material and the tungsten during deposition, as described above. This lower temperature can also suppress any elemental segregation or outgassing, as well as morphological changes, that could degrade adhesion and/or resistivity. Such temperature may be about 450° C. and in some embodiments may be lower, such as 400° C., 350° C., or 300° C., for example.

In block 434, a first portion of the spacer material is deposited onto the tungsten bitline of the substrate. The layer of this material may have a first value of a property of the material that is caused by deposition at the first temperature; this property may be a WER and/or a composition, such as a chemical stoichiometry, and the first value may be, respectively, a high WER and/or composition that prevents or reduces the reaction between the deposited spacer material and the tungsten in order to prevent or to reduce the formation of tungsten nitride.

After, in block 436, the substrate is transferred to a second station in the multi-station deposition apparatus. Once in the second station, the temperature of the substrate is adjusted to a higher temperature as seen with block 438. This second, higher temperature may be selected in order to produce a second portion of the material with a second value of the property that may be a low WER or low dynamic etch rate ("DER") in order to protect the outer portions of the film from subsequent processing, e.g., etching or acidic cleaning, as described above. In addition, the barrier properties or oxidation resistance of the outer portions of the film may need to be adjusted to be compatible with subsequent process chemistries. Such second temperature may be any achievable temperature, such as about 450° C. or about 650° C. In block 440, deposition at this second, higher temperature at the second station produces a second portion of the material having a low WER, such as about 300 Å/min or about 100 Å/min, according to FIG. 10, for instance.

Figure 13:
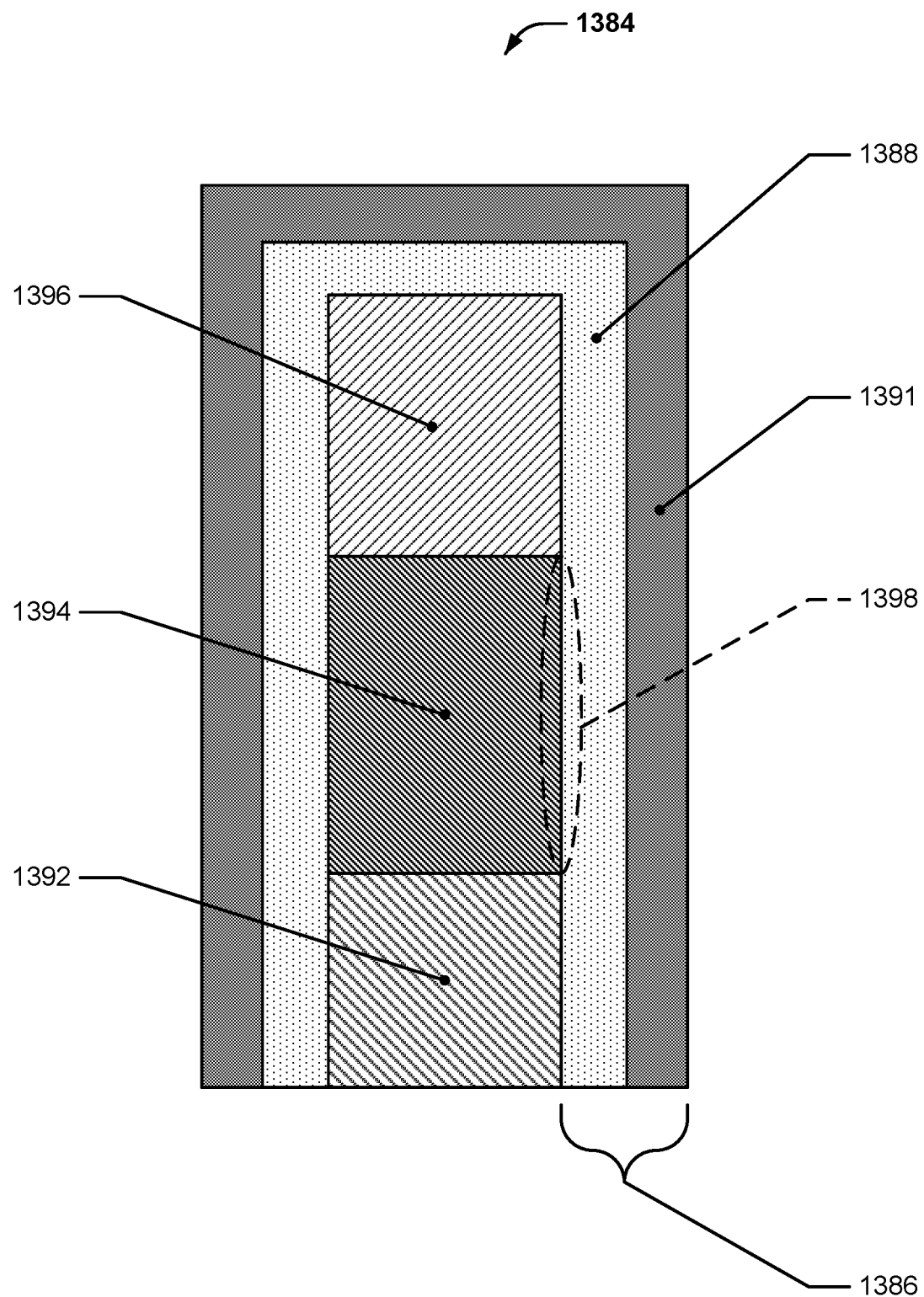
FIG. 13 depicts a partial cross-sectional side view of part of a substrate during an example DRAM processing.

The resulting film of deposited material will have at least two portions that have different values of the property. FIG. 13 depicts a partial cross-sectional side view of part of a substrate during an example DRAM processing. A part of substrate 1384 is seen following deposition of a spacer material 1386, such as silicon nitride, onto a stack of material that includes a first layer of material 1392, such as a polysilicon, a layer of tungsten 1394, and a third layer of material 1396, such as a nitride hard mask. The interface between the spacer material 1386 and the tungsten 1394, identified in the dashed ellipse numbered 1398, is the area where it may be desirable to reduce or eliminate the reaction rate between the spacer material 1386, such as silicon nitride, and the layer of tungsten 1394, as discussed above.

As can be seen in FIG. 13, the deposited material, i.e., the spacer material 1386, includes a first portion 1388 and a second portion 1391. The first portion 1388 represents the portion (e.g., one layer) of the material that is deposited first onto the stack of layers, i.e., the first layer 1392, the layer of tungsten 1394, and the third layer 1396, at the first, low deposition temperature that causes the first portion 1388 to have a first value of a property, e.g., WER, that is a high value (a low temperature corresponds to a high WER value as shown in FIG. 10), or another property, e.g., a composition, such as a chemical stoichiometry, that has a first value that prevents or reduces the reaction between the first portion 1388 and the layer of tungsten 1394 at the interface

1398. The second portion 1391 of the deposited material 1386 is later deposited at the second, higher temperature in order to cause this second portion 1388 to have a second value of the property different than the first value, such as a low WER.

The techniques of this disclosure may also be used in the deposition of an encapsulation layer during PCRAM processing. In this example, FIG. 4 may also be applicable and performed in a similar manner. However, for PCRAM processing, the material being deposited onto the substrate may be different than described above for DRAM processing, such as polymeric, silicon nitride, silicon carbonitride or silicon oxynitride, and such encapsulation material is being deposited onto a stack of material that includes chalcogenide memory elements. The first temperature may be selected so that the chalcogenide memory elements are not subject to degradation (e.g., chemical and/or morphological) when exposed to reactants, such as 250° C. or below, as low as 50° C. The corresponding first value of the property of this layer of material deposited at the first temperature may include a composition, such as a chemical stoichiometry, that prevents or reduces the reaction between the deposited encapsulation material and memory elements. After deposition of the initial portion of encapsulation material onto the memory elements, the temperature may be adjusted to a second, higher temperature as depicted in block 438, such as 400° C., which causes the production of the second portion of encapsulation material with a second value of the property, such as low WER or high hermeticity.

Figure 11:
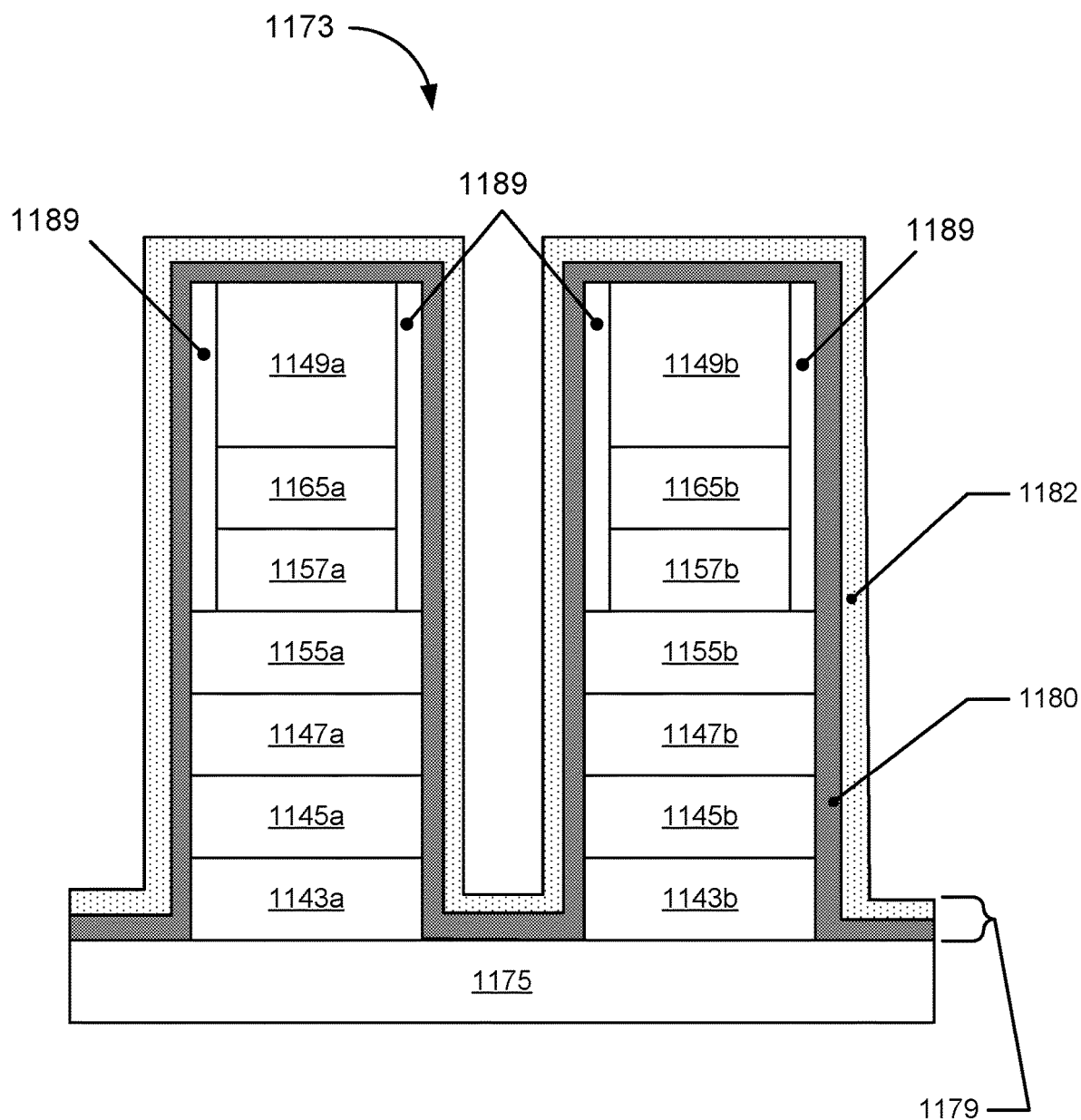
FIG. 11 depicts a, partial cross-sectional side view of part of a substrate during an example PCRAM processing.

FIG. 11 depicts a partial cross-sectional side view of part of a substrate during an example PCRAM processing. Example substrate 1173 includes two memory stacks on a layer of material, such as an oxide layer 1175. One stack includes a tungsten layer 1143*a*, carbon layer 1145*a*, chalcogenide layer 1147*a*, second carbon layer 1155*a*, second chalcogenide layer 1157*a*, third carbon layer 1165*a*, and a nitride layer 1149*a*. The second stack includes a tungsten layer 1143*b*, carbon layer 1145*b*, chalcogenide layer 1147*b*, second carbon layer 1155*b*, second chalcogenide layer 1157*b*, third carbon layer 1165*b*, and a nitride layer 1149*b*. Both stacks include nitride spacers 1189 and an encapsulation film 1179 deposited over the substrate. The encapsulation film 1179 may be a silicon-containing encapsulation film, such as a silicon nitride film, or a silicon carbide film, or a silicon carbon-containing film such as SiCN or SiOC film. As can be seen, the encapsulation film 1179 includes a first portion 1180 and a second portion 1182. The first portion 1180 represents the portion (e.g., one layer) of the material that is deposited at the first, low temperature that causes the first portion of the material 1180 to have a first value of a property, and the second layer 1182 (e.g., the second portion) having the second value of the property as described herein. For example, the first portion 1180 of the material may have a first value of the property that causes limited or no degradation of the chalcogenide layers 1147*a*, 1157*a*, 1147*b*, and 1157*b*, as discussed above.

Detailed Description of Substrate Processing Systems

The methods and techniques described herein may be performed with any suitable system for performing film deposition in a semiconductor processing tool (e.g., any suitable multi-station deposition apparatus). A system for performing film deposition at two or more temperatures in a semiconductor processing tool include hardware for accomplishing the process operations and a system controller having (or having access to) machine-readable instructions for controlling process operations in accordance with the processing techniques disclosed herein.

Thus, in some embodiments, a system suitable for depositing films of material on multiple semiconductor substrates may include a first set of one or more process stations each having a substrate holder (e.g., a pedestal) contained in a processing chamber, a second set of one or more process stations each having a substrate holder contained in the processing chamber, one or more valves for controlling flow of film precursor to the process stations, and one or more valve-operated vacuum sources for removing film precursor from the volumes surrounding the process stations contained in the one or more processing chambers. And, such a system may also include a controller having (or having access to) machine-readable instructions for operating the substrate loading device, the substrate transferring device, the one or more valves, and the vacuum source to deposit films of material onto the substrates.

Therefore, in some embodiments, said instructions executed by the controller may include instructions for forming films on multiple substrates at multiple process stations contained in a processing chamber, wherein multiple layers of the film are formed on each substrate by a sequence of CVD deposition processes or ALD cycles. Thus, in certain such embodiments, said instructions executed by the controller may include instructions for performing ALD operations (1) though (4) as described above, and instructions for repeating ALD operations (1) through (4) multiple times to form multiple layers of film on the multiple substrates at the multiple process stations of the substrate processing apparatus. In some other embodiments, said instructions executed by the controller may include instructions for performing CVD deposition processes on multiple substrates at the multiple process stations of the apparatus.

Accordingly, FIG. 1 schematically shows an embodiment of a substrate processing tool 100 which may be part of the system. For simplicity, the tool 100 is depicted as a stand-alone process station having a process chamber body 102 for maintaining a low-pressure environment. However, it will be appreciated that a plurality of process stations may be included in a common process tool environment—e.g., within a common reaction chamber—as described herein. For example, FIG. 2 depicts an embodiment of a system that includes a multi-station processing tool. Further, it will be appreciated that, in some embodiments, one or more hardware parameters of processing tool 100, including those discussed in detail herein, may be adjusted programmatically by one or more system controllers that is part of the system.

Process chamber 102 fluidly communicates with reactant delivery system 101 for delivering process gases to a distribution showerhead 106. Reactant delivery system 101 includes a mixing vessel 804 for blending and/or conditioning process gases for delivery to showerhead 106. One or more mixing vessel inlet valves 120 may control introduction of process gases to mixing vessel 804.

Some reactants may be stored in liquid form prior to vaporization and subsequent delivery to the process chamber 102. The embodiment of FIG. 1 includes a vaporization point 103 for vaporizing liquid reactant to be supplied to mixing vessel 804. In some embodiments, vaporization point 103 may be a heated liquid injection module. In some embodiments, vaporization point 103 may be a heated vaporizer. The saturated reactant vapor produced from such modules/vaporizers may condense in downstream delivery piping when adequate controls are not in place (e.g., when no helium is used in vaporizing/atomizing the liquid reactant). Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 103 may be heat treated. In some examples, mixing vessel 804 may also be heat treated. In one non-limiting example, piping downstream of vaporization point 103 has an increasing temperature profile extending from approximately 100° C. to approximately 150° C. at mixing vessel 804.

As mentioned, in some embodiments the vaporization point 103 may be a heated liquid injection module ("liquid injector" for short). Such a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 803. In one scenario, a liquid injector may be mounted directly to mixing vessel 804. In another scenario, a liquid injector may be mounted directly to showerhead 106.

In some embodiments, a liquid flow controller (LFC) upstream of vaporization point 103 may be provided for controlling a mass flow of liquid for vaporization and delivery to processing chamber 102. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

The gas delivery system 101 may also be configured to flow and deliver a curtain gas to the processing chamber 102. Some such configurations may include piping, valves, and a curtain gas source. The system suitable for depositing films of material on multiple semiconductor substrates may be configured to flow a curtain gas into the processing chamber from entry points suitable for its role in providing volumetric isolation for the various process stations such as from behind the head portions of each of the chandelier showerheads, from the pedestal, from the showerhead, and/or from the chamber body (e.g., a top wall of the chamber).

Showerhead 106 distributes process gases and/or reactants (e.g., film precursors) toward substrate 112 at the process station, the flow of which is controlled by one or more valves upstream from the showerhead (e.g., valves 120, 120A, 105). In the embodiment shown in FIG. 1, substrate 112 is located beneath showerhead 106, and is shown resting on a pedestal 108. It will be appreciated that showerhead 106 may have any suitable shape, and may have any suitable number and arrangement of ports for distributing processes gases to substrate 112.

In some embodiments, a microvolume 107 is located beneath showerhead 106. Performing an ALD process in a microvolume in the process station near the substrate rather than in the entire volume of a processing chamber may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters.

In some embodiments, as discussed above, the pedestal 108 may be configured to raise or lower the substrate 112 by movement of a lifting mechanism, such as lift pins, within the pedestal 108 and/or movement of the pedestal 108 in order to expose substrate 112 to microvolume 107 and/or to vary a volume of microvolume 107, such as discussed above and shown in FIGS. 5 through 7—such discussion is incorporated herein. For example, the pedestal may include stepper motors and other movement mechanisms and movement configurations that enable the substrate to be elevated above the substrate support surface of the pedestal. For instance, this movement may also increase or decrease the separation distance between the substrate and the substrate support surface of the pedestal. Additionally, for example, in a substrate transfer phase, pedestal 108 may be lowered to allow substrate 112 to be loaded onto pedestal 108. During a deposition on substrate process phase, pedestal 108 may be raised to position substrate 112 within microvolume 107. In some embodiments, microvolume 107 may completely enclose substrate 112 as well as a portion of pedestal 108 to create a region of high flow impedance during a deposition process.

Optionally, pedestal 108 may be lowered and/or raised during portions the deposition process to modulate process pressure, reactant concentration, etc. within microvolume 107. In one scenario where processing chamber body 102 remains at a base pressure during the process, lowering pedestal 108 may allow microvolume 107 to be evacuated. Example ratios of microvolume to process chamber volume include, but are not limited to, volume ratios between 1:500 and 1:10. It will be appreciated that, in some embodiments, pedestal height may be adjusted programmatically by a suitable system controller.

In another scenario, adjusting a height of pedestal 108 may allow a plasma density to be varied during plasma activation and/or treatment cycles included, for example, in an ALD or CVD process. At the conclusion of a deposition process phase, pedestal 108 may be lowered during another substrate transfer phase to allow removal of substrate 112 from pedestal 108.

While the example microvolume variations described herein refer to a height-adjustable pedestal, it will be appreciated that, in some embodiments, a position of showerhead 806 may be adjusted relative to pedestal 108 to vary a volume of microvolume 107. Further, it will be appreciated that a vertical position of pedestal 108 and/or showerhead 106 may be varied by any suitable mechanism within the scope of the present disclosure. In some embodiments, pedestal 108 may include a rotational axis for rotating an orientation of substrate 112. It will be appreciated that, in some embodiments, one or more of these example adjustments may be performed programmatically by one or more suitable system controllers having machine-readable instructions for performing all or a subset of the foregoing operations.

Returning to the embodiment shown in FIG. 1, showerhead 106 and pedestal 108 electrically communicate with RF power supply 114 and matching network 116 for powering a plasma. In some embodiments, the plasma energy may be controlled (e.g., via a system controller having appropriate machine-readable instructions) by controlling one or more of a process station pressure, a gas concentration, an RF source power, an RF source frequency, and a plasma power pulse timing. For example, RF power supply 114 and matching network 116 may be operated at any suitable power to form a plasma having a desired composition of radical species. Examples of suitable powers are included above. Likewise, RF power supply 114 may provide RF power of any suitable frequency. In some embodiments, RF power supply 114 may be configured to control high- and low-frequency RF power sources independently of one another. Example low-frequency RF frequencies may include, but are not limited to, frequencies between 50 kHz and 500 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy (OES) sensors. In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma activation phase may be included in a corresponding plasma activation recipe phase of a process recipe. In some cases, process recipe phases may be sequentially arranged, so that all instructions for a process phase are executed concurrently with that process phase. In some embodiments, instructions for setting one or more plasma parameters may be included in a recipe phase preceding a plasma process phase. For example, a first recipe phase may include instructions for setting a flow rate of an inert (e.g., helium) and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some deposition processes, plasma strikes last on the order of a few seconds or more in duration. In certain implementations described herein, much shorter plasma strikes may be applied during a processing cycle. These may be on the order of 50 milliseconds to 1 second, with 0.25 seconds being a specific example. Such short RF plasma strikes require quick stabilization of the plasma. To accomplish this, the plasma generator may be configured such that the impedance match is preset to a particular voltage, while the frequency is allowed to float. Conventionally, high-frequency plasmas are generated at an RF frequency at about 13.56 MHz. In various embodiments disclosed herein, the frequency is allowed to float to a value that is different from this standard value. By permitting the frequency to float while fixing the impedance match to a predetermined voltage, the plasma can stabilize much more quickly, a result which may be important when using the very short plasma strikes associated with ALD cycles.

Figure 12:
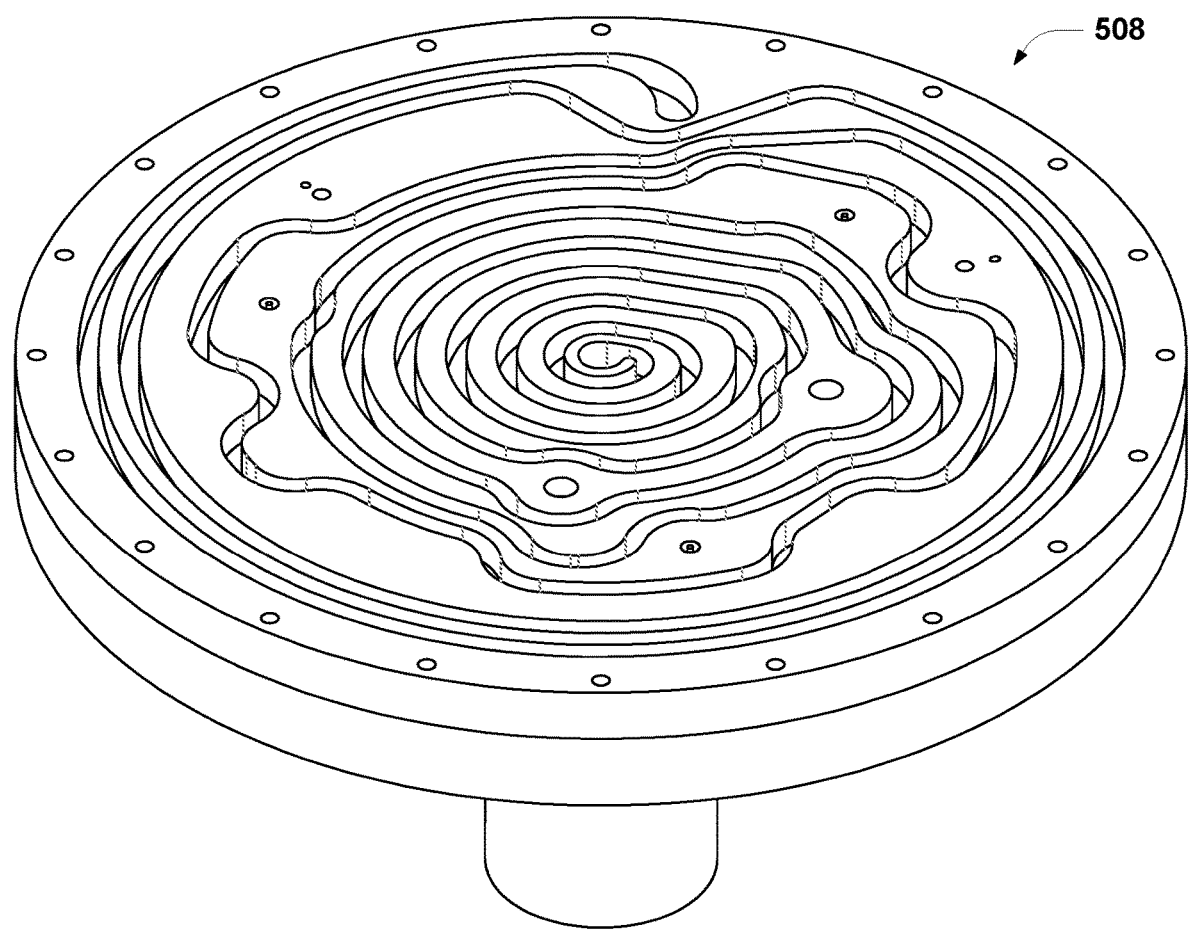
FIG. 12 depicts a cross-sectional view of the pedestal of FIG. 5.

In some embodiments, pedestal 108 may be temperature controlled by a heating element 110 within the pedestal. Heating element 110 may be a resistive heating coil embedded into an aluminum pedestal 108 or it may be a heating wire embedded in an aluminum nitride pedestal, for instance. The heating element may be arranged in any suitable fashion within the pedestal in order to provide suitable heating of the pedestal and substrate support surface of the pedestal 108 for the processes, such as between about 50° C. to about 635° C. FIG. 12 depicts a cross-sectional view of the pedestal of FIG. 5. The pedestal has been sectioned in a direction perpendicular to the z-axis depicted in FIG. 5. As can be seen, the pedestal 508 includes a pathway in which a heating coil or wire may be placed in order to heat the pedestal 508 as well as the substrate support surface of the pedestal 508. The heating element may be configured to heat the pedestal and cause thermal transfer between the pedestal and the substrate. Although not depicted, the pedestal may also include cooling mechanisms that are configured to cool or decrease the temperature of the pedestal and substrate.

Referring back to FIG. 1, in some embodiments, pressure control for processing apparatus 100 may be provided by one or more valve-operated vacuum sources such as butterfly valve 118. As shown in the embodiment of FIG. 1, butterfly valve 118 throttles a vacuum provided by a downstream vacuum pump (not shown). However, in some embodiments, pressure control of processing apparatus 100 may also be adjusted by varying a flow rate of one or more gases introduced to processing chamber 102. In some embodiments, the one or more valve-operated vacuum sources—such as butterfly valve 118—may be used for removing film precursor from the volumes surrounding the process stations during the appropriate ALD operational operations.

As described above, one or more process stations may be included in a multi-station substrate processing tool. FIG. 2 schematically illustrates an example of a system that includes a multi-station processing tool 200 which includes a plurality of process stations 201, 202, 203, 204 in a common low-pressure processing chamber 214. By maintaining each station in a low-pressure environment, defects caused by vacuum breaks between film deposition processes may be avoided.

As shown in FIG. 2, the system 200 has a substrate loading port 220, and a substrate handler robot 226 configured to move substrates from a cassette loaded from a pod 228, through atmospheric port 220, into the processing chamber 214, and finally onto a process station. Specifically, in this case, the substrate handler robot 226 loads substrates at process stations 201 and 202, and a substrate transferring device, in this case substrate carousel 290, transfers substrates between the various process stations 201, 202, 203, and 204. In the embodiment shown in FIG. 2, the substrate loading device is depicted as substrate handler robot 226 having 2 arms for substrate manipulation, and so, as depicted, it could load substrates at both stations 201 and 202 (perhaps simultaneously, or perhaps sequentially). Then, after loading at stations 201 and 202, the substrate transferring device, carousel 290 depicted in FIG. 2, can do a 180 degree rotation (about its central axis, which is substantially perpendicular to the plane of the substrates (coming out of the page), and substantially equidistant between the substrates) to transfer the two substrates from stations 201 and 202 to stations 203 and 204. At this point, handler robot 226 can load 2 new substrates at stations 201 and 202, completing the loading process. To unload, these steps can be reversed, except that if multiple sets of 4 substrates are to be processed, each unloading of 2 substrates by handler robot 226 would be accompanied by the loading of 2 new substrates prior to rotating the transferring carousel 290 by 180 degrees. Analogously, a one-armed handler robot configured to place substrates at just 1 station, say 201, would be used in a 4 step load process accompanied by 4 rotations of carousel 290 by 90 degrees to load substrates at all 4 stations.

The depicted processing chamber 214 shown in FIG. 2 provides four process stations, 201, 202, 203, and 204. Each station has a heated pedestal and gas line inlets. It will be appreciated that in some embodiments, each process station may have different or multiple purposes. For example, in some embodiments, a process station may be switchable between an ALD process mode and a CVD process mode. Additionally or alternatively, in some embodiments, processing chamber 214 may include one or more matched pairs of ALD/CVD process stations. While the depicted processing chamber 214 comprises 4 process stations, it will be understood that a processing chamber according to the present disclosure may have any suitable number of stations. For example, in some embodiments, a processing chamber may have 1, or 2, or 3, or 4, or 5, or 6, or 7, or 8, or 9, or 10, or 11, or 12, or 13, or 14, or 15, or 16, or more process stations (or a set of embodiments may be described as having a number of process stations per reaction chamber within a range defined by any pair of the foregoing values, such as having 2 to 6 process stations per reaction chamber, or 4 to 8 process stations per reaction chamber, or 8 to 16 process stations per reaction chamber, etc.).

Furthermore, as discussed above, the multi-station deposition apparatus is configured to independently control the temperature of two or more of the process stations so that two or more of the process stations may be heated to a different temperature. For example, station 201 may have first temperature T1, while stations 202, 203, and 204 have second temperature T2. Stations 201, 202, 203, and 204 may also each have different temperatures T1, T2, T3, and T4, respectively. As discussed above, the combinations of temperatures for each station may vary considerably and may be limited based on the number of stations in the multi-station deposition apparatus. And as also discussed above, temperatures for a substrate at each station may be further adjustable by adjusting the separation distance between the substrate and the substrate support surface of each station.

As indicated above, FIG. 2 depicts an embodiment of a substrate transferring device 290 for transferring substrates between process stations 201, 202, 203, and 204 within processing chamber 214. It will be appreciated that any suitable substrate transferring device may be employed. Non-limiting examples include substrate carousels and substrate handler robots.

System Controllers

FIG. 2 also depicts an embodiment of a system that includes a system controller 250 employed to control process conditions and hardware states of process tool 200 and its process stations. System controller 250 may include one or more memory devices 256, one or more mass storage devices 254, and one or more processors 252. Processor 252 may include one or more CPUs, ASICs, general-purpose computer(s) and/or specific purpose computer(s), one or more analog and/or digital input/output connection(s), one or more stepper motor controller board(s), etc.

In some embodiments, system controller 250 controls some or all of the operations of process tool 200 including the operations of its individual process stations. System controller 250 may execute machine-readable system control instructions 258 on processor 252—the system control instructions 258, in some embodiments, loaded into memory device 256 from mass storage device 254. System control instructions 258 may include instructions for controlling the timing, mixture of gaseous and liquid reactants, chamber and/or station pressure, chamber and/or station temperature, heating element temperature, substrate temperature, target power levels, RF power levels, RF exposure time, substrate pedestal, chuck, and/or susceptor position, lift pin positions, and other parameters of a particular process performed by process tool 200. These processes may include various types of processes including, but not limited to, processes related to deposition of film on substrates. System control instructions 258 may be configured in any suitable way. For example, various process tool component subroutines or control objects may be written to control operation of the process tool components necessary to carry out various process tool processes. System control instructions 258 may be coded in any suitable computer readable programming language. In some embodiments, system control instructions 258 are implemented in software, in other embodiments, the instructions may be implemented in hardware—for example, hard-coded as logic in an ASIC (application specific integrated circuit), or, in other embodiments, implemented as a combination of software and hardware.

In some embodiments, system control software 258 may include input/output control (IOC) sequencing instructions for controlling the various parameters described above. For example, each phase of a deposition process or processes may include one or more instructions for execution by system controller 250. The instructions for setting process conditions for a film deposition process phase, for example, may be included in a corresponding deposition recipe phase, and likewise for a capping film deposition phase. In some embodiments, the recipe phases may be sequentially arranged, so that all instructions for a process phase are executed concurrently with that process phase.

Other computer-readable instructions and/or programs stored on mass storage device 254 and/or memory device 256 associated with system controller 250 may be employed in some embodiments. Examples of programs or sections of programs include a substrate positioning program, a process gas control program, a pressure control program, a heater control program, and a plasma control program.

A substrate positioning program may include instructions for process tool components that are used to load the substrate onto pedestal 218 and to control the spacing between the substrate and other parts of process tool 200. The positioning program may include instructions for appropriately moving substrates in and out of the reaction chamber as necessary to deposit film on the substrates.

A process gas control program may include instructions for controlling gas composition and flow rates and optionally for flowing gas into the volumes surrounding one or more process stations prior to deposition in order to stabilize the pressure in these volumes, e.g., curtain gas. In some embodiments, the process gas control program may include instructions for introducing certain gases into the volume(s) surrounding the one or more process stations within a processing chamber during film deposition on substrates. The process gas control program may also include instructions to deliver these gases at the same rates, for the same durations, or at different rates and/or for different durations depending on the composition of the film being deposited. The process gas control program may also include instructions for atomizing/vaporizing a liquid reactant in the presence of helium or some other carrier gas in a heated injection module.

A pressure control program may include instructions for controlling the pressure in the process station by regulating, for example, a throttle valve in the exhaust system of the process station, a gas flow into the process station, etc. The pressure control program may include instructions for maintaining the same or different pressures during deposition of the various film types on the substrates.

A heater control program may include instructions for controlling the current to a heating unit that is used to heat the pedestals and substrates. Alternatively or in addition, the heater control program may control delivery of a heat transfer gas (such as helium) to the substrate. The heater control program may include instructions for maintaining the same or different temperatures in the reaction chamber and/or volumes surrounding the process stations during deposition of the various film types on the substrates. This heater control program may also include instructions for independently controlling the temperature at each pedestal as well as raising or lowering the pedestal and/or lift pins to adjust the separation distance between the substrate and the substrate support surface of the pedestal (e.g., raising or lowering the lift pins while the pedestal remains stationary, or raising or lowering the pedestal while the substrate remains stationary).

A plasma control program may include instructions for setting RF power levels, frequencies, and exposure times in one or more process stations in accordance with the embodiments herein. In some embodiments, the plasma control program may include instructions for using the same or different RF power levels and/or frequencies and/or exposure times during film deposition on the substrates.

In some embodiments, there may be a user interface associated with system controller 250. The user interface may include a display screen, graphical software displays of the apparatus and/or process conditions, and user input devices such as pointing devices, keyboards, touch screens, microphones, etc.

In some embodiments, parameters adjusted by system controller 250 may relate to process conditions. Non-limiting examples include process gas compositions and flow rates, temperatures, pressures, plasma conditions (such as RF bias power levels and exposure times), etc. These parameters may be provided to the user in the form of a recipe, which may be entered utilizing the user interface.

Signals for monitoring the processes may be provided by analog and/or digital input connections of system controller 250 from various process tool sensors. The signals for controlling the processes may be output on the analog and/or digital output connections of process tool 200. Non-limiting examples of process tool sensors that may be monitored include mass flow controllers (MFCs), pressure sensors (such as manometers), thermocouples, etc. Appropriately programmed feedback and control algorithms may be used with data from these sensors to maintain process conditions.

For instance, the controller may include instructions for monitoring the temperature of the substrate and/or pedestal in situ, e.g., during a deposition process, and for adjusting the temperature of the substrate and/or pedestal in response to such monitoring or measurements. For example, the controller may monitor and detect the temperature of one or more process stations and adjust the separation distance between the substrate and the substrate support surface of the pedestal in-between deposition cycles of an ALD process based on the detected temperature in order to raise or lower the temperature of the substrate.

System controller 250 may provide machine-readable instructions for implementing the herein-described deposition processes. The instructions may control a variety of process parameters, such as DC power level, RF bias power level, pressure, temperature, etc. The instructions may control the parameters to operate in-situ deposition of film stacks according to various embodiments described herein.

The various apparatuses and methods described above may be used in conjunction with lithographic patterning tools and/or processes, for example, for the fabrication or manufacture of semiconductor devices, displays, LEDs, photovoltaic panels and the like. Typically, though not necessarily, such tools will be used or processes conducted together and/or contemporaneously in a common fabrication facility.

Lithographic patterning of a film typically includes some or all of the following operations, each operation enabled with a number of possible tools: (1) application of photoresist on a substrate, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a substrate stepper; (4) developing the resist so as to selectively remove resist and thereby pattern it using a tool such as a wet bench or a spray developer; (5) transferring the resist pattern into an underlying film or substrate by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

Depositing Layers of Material at Different Temperatures In Substrate Processing Systems The systems and apparatuses discussed herein may be used to implement the techniques for depositing layers of material at different temperatures as described above. In some such embodiments, a system for performing film deposition in a multi-station semiconductor processing tool may include one or more aspects of the systems described herein, such as a heating element in the pedestal and a multi-station reactor that is configured to have two or more stations at different temperatures.

The system may also include a controller, like the system controller described herein, e.g., system controller 250 of FIG. 2, for controlling the system to deposit a first portion of material on a substrate at a first temperature and a second portion of material on the substrate at a second temperature, as described herein above. The controller may include control logic for implementing some or all aspects of the techniques discussed above, including all such aspects described above with respect to FIGS. 4, 8, and 9.

For example, in one embodiment, the multi-station deposition apparatus may include a processing chamber with at least two processing stations that each have a pedestal with a heating element configured to heat a substrate located in that process station. For example, this may include the multi-station deposition apparatus depicted in FIG. 2. The apparatus may also include a controller for controlling the multi-station deposition apparatus to deposit a material onto a substrate at two or more different temperatures, as described above. The controller may include control logic for performing the blocks of the techniques described above, including that of FIG. 4 which include (a) providing a substrate to the first station of the multi-station deposition apparatus, (b) adjusting the temperature of the substrate to a first temperature through heat transfer between the substrate and the first pedestal, (c) depositing a first portion of the material on the substrate while the substrate is at the first temperature in the first station, (d) transferring the substrate to the second station, (e) adjusting the temperature of the substrate to a second temperature through heat transfer between the substrate and the second pedestal, and (f) depositing a second portion of the material on the substrate while the substrate is at the second temperature, such that the first portion and the second portion exhibit different values of a property of the material.

The multi-station deposition apparatus may also be configured such that each pedestal includes a substrate support surface, is configured to cause the substrate to be contacting the substrate support surface, and is configured to cause the substrate to be separated from the substrate support surface by a first separation distance and by a second separation distance. The controller may also include control logic for positioning the substrate at the first separation distance and at the second separation distance, and performing (a) through (c), (e), and (f) at the first station of the multi-station deposition apparatus. Additionally, (b) may further include adjusting the temperature of the substrate to the first temperature by causing the substrate to be separated from the substrate support surface of the pedestal of the first station by a first separation distance, (c) may further include depositing the first portion of the material while the substrate is separated from the substrate support surface by the first separation distance, (e) may further include adjusting the temperature of the substrate to the second temperature by causing the substrate to be separated from the substrate support surface of the pedestal of the first station by a second separation distance, and (f) may further include depositing the material on the substrate while the substrate is separated from the substrate support surface by of the pedestal of the first station the second separation distance.

In some other embodiments, the multi-station deposition apparatus may be configured as stated herein above, but (b) may include adjusting the temperature of the substrate to the first temperature through heat transfer between the substrate and the pedestal in the first station while the substrate is separated from a substrate support surface of the pedestal of the first station by a first separation distance. The controller may also include control logic for performing the following: after (c) and before (d), adjusting the temperature of the substrate to a third temperature by causing the substrate to be separated from the substrate support surface of the pedestal of the first station by a second separation distance, and after (c) and before (d), depositing a third portion of the material on the substrate while the substrate is in the first station, at second separation distance, and at the third temperature. Here, the third portion may exhibit different values of the property of the material than one or more of the first portion and the second portion of the material.

What is claimed is:

1. A method of depositing a material onto a substrate in a multi-station deposition chamber, the method comprising:
   heating a substrate to a first temperature at a first station of the multi-station deposition chamber;
   depositing a first portion of the material onto the substrate while the substrate is at the first temperature in the first station;
   transferring the substrate from the first station to a second station in the multi-station deposition chamber and heating the temperature of the substrate to a second temperature; and
   depositing a second portion of the material on the substrate while the substrate is at the second temperature, wherein the first portion and the second portion exhibit different values of one or more properties of the material.

2. The method of claim 1, wherein the second temperature is greater than the first temperature.

3. The method of claim 2, further comprising:
   transferring the substrate from the second station to a third station of the multi-station deposition chamber and adjusting the temperature of the substrate to a third temperature greater than the second temperature; and
   depositing a third portion of the material on the substrate while the substrate is at the third temperature at the third station, wherein the second portion and the third portion exhibit different values of one or more properties of the material.

4. The method of claim 2, further comprising:
   transferring the substrate from the second station to a third station of the multi-station deposition chamber and adjusting the temperature of the substrate to the second temperature; and
   depositing a third portion of the material on the substrate while the substrate is at the second temperature at the third station, wherein the second portion and the third portion exhibit substantially the same values of one or more properties of the material.

5. The method of claim 2, further comprising:
   transferring, before transferring the substrate to the second station, the substrate from the first station to a third station of the multi-station deposition chamber and adjusting the temperature of the substrate to the first temperature; and
   depositing a third portion of the material on the substrate while the substrate is at the first temperature at the third station, wherein the first portion and the third portion exhibit substantially the same values of one or more properties of the material.

6. The method of claim 2, wherein the first temperature is about 100° C. and the second temperature is about 200° C.

7. The method of claim 1, wherein the second temperature is less than the first temperature.

8. The method of claim 7, further comprising:
   transferring the substrate from the second station to a third station of the multi-station deposition chamber and adjusting the temperature of the substrate to a third temperature less than the second temperature; and
   depositing a third portion of the material on the substrate while the substrate is at the third temperature at the third station, wherein the second portion and the third portion exhibit different values of one or more properties of the material.

9. The method of claim 7, further comprising:
transferring the substrate from the second station to a third station of the multi-station deposition chamber and adjusting the temperature of the substrate to the second temperature; and
depositing a third portion of the material on the substrate while the substrate is at the second temperature at the third station, wherein the second portion and the third portion exhibit substantially the same values of one or more properties of the material.

10. The method of claim 7, further comprising:
transferring, before transferring the substrate to the second station, the substrate from the first station to a third station of the multi-station deposition chamber and adjusting the temperature of the substrate to the first temperature; and
depositing a third portion of the material on the substrate while the substrate is at the first temperature at the third station, wherein the first portion and the third portion exhibit substantially the same values of one or more properties of the material.

11. The method of claim 1, wherein the material is silicon nitride and a surface of the substrate onto which the material is deposited comprises tungsten.

12. The method of claim 1, wherein the material is silicon nitride and a surface of the substrate onto which the material is deposited comprises chalcogenide.

13. A method of depositing a material onto a substrate in a multi-station deposition chamber, the method comprising:
heating a substrate to a first temperature by positioning the substrate away from a first support surface of a first pedestal at a first station of the multi-station deposition chamber by a first separation distance;
depositing a first portion of the material onto the substrate while the substrate is at the first temperature in the first station;
transferring the substrate from the first station to a second station in the multi-station deposition chamber;
adjusting the temperature of the substrate to a second temperature by positioning the substrate away from a second support surface of a second pedestal at the second station of the multi-station deposition chamber by a second separation distance; and
depositing a second portion of the material on the substrate while the substrate is at the second temperature.

14. The method of claim 13, wherein the first portion and the second portion exhibit different values of one or more properties of the material.

15. The method of claim 13, wherein the second separation distance is less than the first separation distance.

16. The method of claim 15, further comprising:
transferring the substrate from the second station to a third station of the multi-station deposition chamber;
heating the temperature of the substrate to a third temperature greater than the first temperature and the second temperature by positioning the substrate away from a third support surface of a third pedestal at the third station of the multi-station deposition chamber by a third separation distance less than the second separation distance; and
depositing a third portion of the material on the substrate while the substrate is at the third temperature at the third station, wherein the first portion, the second portion, and the third portion exhibit different values of one or more properties of the material.

17. The method of claim 13, wherein the second separation distance is greater than the first separation distance.

18. The method of claim 17, further comprising:
transferring the substrate from the second station to a third station of the multi-station deposition chamber;
heating the temperature of the substrate to a third temperature less than the first temperature and the second temperature by positioning the substrate away from a third support surface of a third pedestal at the third station of the multi-station deposition chamber by a third separation distance greater than the second separation distance; and
depositing a third portion of the material on the substrate while the substrate is at the third temperature at the third station, wherein the first portion, the second portion, and the third portion exhibit different values of one or more properties of the material.

19. The method of claim 13, wherein the material is silicon nitride and a surface of the substrate onto which the material is deposited comprises tungsten.

20. The method of claim 13, wherein the material is silicon nitride and a surface of the substrate onto which the material is deposited comprises chalcogenide.

* * * * *